United States Patent
Sasai et al.

(10) Patent No.: US 8,942,493 B2
(45) Date of Patent: Jan. 27, 2015

(54) IMAGE CODING METHOD, IMAGE DECODING METHOD, IMAGE CODING APPARATUS, AND IMAGE DECODING APPARATUS

(75) Inventors: Hisao Sasai, Osaka (JP); Takahiro Nishi, Nara (JP); Youji Shibahara, Osaka (JP); Kyoko Tanikawa, Osaka (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 45 days.

(21) Appl. No.: 13/504,250

(22) PCT Filed: Nov. 1, 2010

(86) PCT No.: PCT/JP2010/006440
§ 371 (c)(1),
(2), (4) Date: Apr. 26, 2012

(87) PCT Pub. No.: WO2011/052234
PCT Pub. Date: May 5, 2011

(65) Prior Publication Data
US 2012/0219230 A1    Aug. 30, 2012

(30) Foreign Application Priority Data
Nov. 2, 2009   (JP) .................................. 2009-252453

(51) Int. Cl.
*G06K 9/00*     (2006.01)
*H03M 7/40*    (2006.01)
(Continued)

(52) U.S. Cl.
CPC ....... *H03M 7/4006* (2013.01); *H04N 19/00951* (2013.01); *H04N 19/00121* (2013.01); *H04N 19/00218* (2013.01)

USPC ............................ 382/233; 375/141; 375/240

(58) Field of Classification Search
CPC ..................................................... H03M 7/4012
See application file for complete search history.

(56) References Cited

U.S. PATENT DOCUMENTS

| 5,903,676 | A | 5/1999 | Wu et al. |
| 7,408,487 | B2 | 8/2008 | Cho |

(Continued)

FOREIGN PATENT DOCUMENTS

| CN | 1610265 A | 4/2005 |
| JP | 7-273664 | 10/1995 |
| JP | 2007-228582 | 9/2007 |

OTHER PUBLICATIONS

International Search Report issued Dec. 14, 2010 in corresponding International Application No. PCT/JP2010/006440.

(Continued)

*Primary Examiner* — Tsung-Yin Tsai
(74) *Attorney, Agent, or Firm* — Wenderoth, Lind & Ponack, L.L.P.

(57) ABSTRACT

An image coding method for performing compression-coding on image data includes: binarizing a signal to be coded of the image data, to generate a binary signal; determining a low-order context which is a context associated with a type of the signal to be coded, and a high-order context that is common to the low-order context and a context associated with another type; calculating coding probability information to be used in arithmetic coding of the binary signal, using (i) high-order probability information corresponding to the determined high-order context and (ii) low-order probability information corresponding to the determined low-order context; performing the arithmetic coding on the binary signal using the coding probability information; and updating the high-order probability information and the low-order probability information based on the binary signal.

10 Claims, 21 Drawing Sheets

(51) Int. Cl.
*H04N 19/91* (2014.01)
*H04N 19/13* (2014.01)
*H04N 19/159* (2014.01)

(56) References Cited

U.S. PATENT DOCUMENTS

| | | | |
|---|---|---|---|
| 7,742,528 B2 * | 6/2010 | Kondo et al. | 375/240.23 |
| 7,970,059 B2 * | 6/2011 | Kondo et al. | 375/240.23 |
| 8,254,707 B2 * | 8/2012 | Fukuhara et al. | 382/233 |
| 8,548,027 B2 * | 10/2013 | Zeng et al. | 375/141 |
| 8,665,943 B2 * | 3/2014 | Fukuhara et al. | 375/240 |
| 2004/0008130 A1 | 1/2004 | Yang et al. | |
| 2005/0088324 A1 | 4/2005 | Fuchigami et al. | |
| 2007/0194953 A1 | 8/2007 | Cho | |
| 2009/0074052 A1 * | 3/2009 | Fukuhara et al. | 375/240.01 |
| 2009/0092326 A1 * | 4/2009 | Fukuhara et al. | 382/233 |
| 2010/0220768 A1 * | 9/2010 | Zeng et al. | 375/141 |

OTHER PUBLICATIONS

Masayuki Hashimoto et al., "Hierarchical Image Coding and Transmission Scheme for Telemedicine Using Segmented Haar Wavelet Transform and Golomb-Rice Codes", Journal of the Institute of Electronics, Information and Communication Engineers D-II, vol. J83-D-II, No. 1, Jan. 2000, pp. 303-310 (with English translation).

Thomas Wiegand, "Joint Final Committee Draft (JFCD) of Joint Video Specification (ITU-T Rec. H.264 | ISO/IEC 14496-10 AVC)", Joint Video Team (JVT) of ISO/IEC MPEG and ITU-T VCEG, Aug. 10, 2002, pp. 92-112.

International Standard, ISO/IEC 14496-10, "Information technology—Coding of audio-visual objects—Part 10: Advanced Video Coding", Second Edition, Oct. 1, 2004, pp. 1-267.

Thomas Wiegand et al., "Overview of the H.264/AVC Video Coding Standard", IEEE Transactions on Circuits and Systems for Video Technology, vol. 13, No. 7, Jul. 2003, pp. 560-576.

* cited by examiner

FIG. 2

| Index ctxIdx | Occurrence probability pStateIdx | Symbol valMPS |
|---|---|---|
| 0 | 12 | 1 |
| 1 | 7 | 0 |
| 2 | 41 | 0 |
| 3 | 22 | 1 |
| 4 | 10 | 1 |
| 5 | 8 | 0 |
| 6 | 50 | 1 |
| ⋮ | ⋮ | ⋮ |

FIG. 3

| SE | 0 | 1 | 2 | 3 | 4 | 5 | 6 | 7 | ... |
|---|---|---|---|---|---|---|---|---|---|
| ctxIdx(high-order) | 0 | 1 | 2 | 5 | 14 | 14 | 15 | 15 | ... |
| ctxIdx(low-order) | — | — | — | — | 24 | 25 | 26 | 27 | ... |

Without hierarchization: columns 0–3. With hierarchization: columns 4–7.

FIG. 9

| pStateIdx  | 0  | 1  | 2  | 3  | 4  | 5  | 6  | 7  | 8  | 9  | 10 | 11 | 12 | 13 | 14 | 15 |
|------------|----|----|----|----|----|----|----|----|----|----|----|----|----|----|----|----|
| transIdxLPS| 0  | 0  | 1  | 2  | 2  | 4  | 4  | 5  | 6  | 7  | 8  | 9  | 9  | 11 | 11 | 12 |
| transIdxMPS| 1  | 2  | 3  | 4  | 5  | 6  | 7  | 8  | 9  | 10 | 11 | 12 | 13 | 14 | 15 | 16 |
| pStateIdx  | 16 | 17 | 18 | 19 | 20 | 21 | 22 | 23 | 24 | 25 | 26 | 27 | 28 | 29 | 30 | 31 |
| transIdxLPS| 13 | 13 | 15 | 15 | 16 | 16 | 18 | 18 | 19 | 19 | 21 | 21 | 22 | 22 | 23 | 24 |
| transIdxMPS| 17 | 18 | 19 | 20 | 21 | 22 | 23 | 24 | 25 | 26 | 27 | 28 | 29 | 30 | 31 | 32 |

US 8,942,493 B2

IMAGE CODING METHOD, IMAGE DECODING METHOD, IMAGE CODING APPARATUS, AND IMAGE DECODING APPARATUS

TECHNICAL FIELD

The present invention relates to image coding methods and image decoding methods, and particularly relates to an image coding method and an image decoding method for performing arithmetic coding and arithmetic decoding.

BACKGROUND ART

In recent years, the number of applications for, for example, video on demand-type services, which include video conferencing via the Internet, and streaming of digital video broadcasts and video content, is increasing, and these applications are reliant on transmission of video information. When video data is transmitted or recorded, a significant amount of data is transmitted via a conventional transmission path having limited bandwidth, or is stored in a conventional recording medium having limited data capacity. In order for the video information to be transmitted through a conventional transmission channel or stored in a conventional recording medium, it is essential to compress or reduce the amount of digital data.

In view of this, video coding standards are being developed for the compression of video data. Such video coding standards are, for example, the International Telecommunication Union-Telecommunication Standardization Sector (ITU-T) Standard denoted by H.26x and the ISO/IEC Standard denoted by MPEG-x. The most recent and most advanced video coding standards at present are the standards denoted by H.264/AVC and MPEG-4 AVC (see NPL 1 and NPL 2).

Roughly divided, the H.264/AVC Standard consists of processes such as prediction, transformation, quantization, and entropy coding. Among these processes, entropy coding reduces redundancy in information used in prediction, quantized information, and so on. Variable-length coding, adaptive coding, fixed-length coding, and so on, are known as types of entropy coding. Variable-length coding includes Huffman coding, run length coding, arithmetic coding, and so on. Among these, arithmetic coding is a scheme in which the output code is determined while calculating the occurrence probability of symbols, and is known to have high coding efficiency compared to Huffman coding, and the like, which use a fixed coding table, because the codes are determined according to the features of image data.

The operation in conventional arithmetic coding shall be described using FIG. 21 and FIG. 22.

First, the flow of arithmetic coding is described below using FIG. 21.

When arithmetic coding is started for a certain type of signal, binarization is performed using a predetermined method that is in accordance with the type of the signal in step S11. Next, in step S12, a context control process that is in accordance with the type of the signal is performed. In the context control process, a symbol occurrence probability that is in accordance with the signal type is read from a memory in which plural symbol occurrence probabilities are stored, and the read symbol occurrence probability is outputted. In step S13, arithmetic coding is performed on the information to be processed, using the symbol occurrence probability received from step S12, and the result is outputted as an output signal.

In step S14, the value of the corresponding symbol occurrence probability is updated based on the binarized information calculated in step S11 and stored as the symbol occurrence probability. When the arithmetic coding of the information to be processed is completed, arithmetic coding is performed again for the next information to be processed.

FIG. 22 is a block diagram showing a configuration of an arithmetic coding unit which shows the process for the arithmetic coding in the conventional H.264/AVC. As shown in FIG. 22, an arithmetic coding unit 10 includes a binarization unit 11, a symbol occurrence probability storage unit 12, a context control unit 13, and a binary arithmetic encoder 14.

An input signal SI, which is a signal that becomes the coding target, and a signal type information indicating the type of the input signal SI are inputted to the arithmetic coding unit 10. The binarization unit 11 converts the input signal SE into the binary information (symbol) "0" or "1" based on the signal type information SE, and sends a binary signal BIN to the binary arithmetic encoder 14 and the context control unit 13.

The context control unit 13 obtains, from the symbol occurrence probability storage unit 12, the symbol occurrence probability PE corresponding to the signal type information SE. Furthermore, the context control unit 13 performs the update process for the symbol occurrence probability PE corresponding to the signal type information SE based on the binary signal BIN corresponding to the input signal SI and inputted from the binarization unit 11, and stores the updating result in the symbol occurrence probability storage unit 12.

The binary arithmetic encoder 14 performs, on the binary signal BIN, an arithmetic coding process based on the symbol occurrence probability PE.

CITATION LIST

Non Patent Literature

[NPL 1] ISO/IEC 14496-10 "MPEG-4 Part 10, Advanced Video coding"

[NPL 2] Thomas Wiegand et al, "Overview of the H.264/AVC Video Coding Standard", IEEE TRANSACTIONS ON CIRCUITS AND SYSTEMS FOR VIDEO TECHNOLOGY, JULY 2003, pp. 560-576

SUMMARY OF INVENTION

Technical Problem

However, in the above-described conventional technique, although the context control unit derives, from the signal type information, one symbol occurrence probability corresponding to the signal to be coded, it is extremely difficult to classify the types of images in proper proportions.

For example, in the case of performing arithmetic coding on quantized coefficients that have been transformed and quantized, when the positions of the quantized coefficients are different, the quantized coefficients are classified as different types. In addition, it is possible to classify the type according to the prediction method used for generating the quantized coefficient, and extremely fine classification is also possible.

However, when an extremely fine classification is carried out, the occurrence frequency of an update process for such classification decreases, control according to image data features, which is the advantage of arithmetic coding, becomes difficult, and thus coding efficiency deteriorates. On the other hand, when classification is broadened, signals of a different type get mixed in which makes prediction of symbol occurrence frequency difficult, and thus coding efficiency deteriorates.

In view of this, the present invention was conceived in order to solve the above-described conventional problem and has as an object to provide an image coding method and an image decoding method capable of increasing the accuracy of prediction of probability information such as symbol occurrence probability.

Solution to Problem

In order to solve the above-described conventional problem, the image coding method according to an aspect of the present invention is an image coding method for performing compression-coding on image data, the image coding method including: binarizing a signal to be coded of the image data, to generate a binary signal; determining (i) a low-order context which is a context associated with a type of the signal to be coded and (ii) a high-order context that is common to the low-order context and a context associated with another type; calculating coding probability information to be used in arithmetic coding of the binary signal, using (i) high-order probability information corresponding to the determined high-order context and (ii) low-order probability information corresponding to the determined low-order context; performing the arithmetic coding on the binary signal using the coding probability information; and updating the high-order probability information and the low-order probability information based on the binary signal.

Accordingly, since probability information that takes into consideration both the overall statistical information according to probability information of the high hierarchical level and detailed statistical information according probability information of the low hierarchical level is used, probability information prediction accuracy can be improved, and thus coding efficiency can be improved. Furthermore, since both the high-order probability information and low-order probability information are updated, the high-order probability information for another type is also updated. Therefore, the accuracy of prediction of probability information for another type can be improved, and thus coding efficiency can be further improved.

Furthermore, the image coding method may further include obtaining type information indicating the type of the signal to be coded, wherein in the determining, the high-order probability information and the low-order probability information may be determined by referring, based on the type information, to a table in which the following are associated with one another: a plurality of types; a high-order context common to the types; and low-order contexts each associated with a corresponding one of the types.

Accordingly, by using a table, hierarchized contexts can be managed easily.

Furthermore, in the calculating, the coding probability information may be calculated by weighted-summation of the high-order probability information and the low-order probability information.

Accordingly, coding efficiency can be improved.

Furthermore, the image coding method may further include obtaining a control signal to be used in the calculation of the coding probability information, wherein in the calculating, the coding probability information may be calculated using the high-order probability information, the low-order probability information, and the control signal.

Accordingly, by using the control signal, more detailed probability information can be calculated, and thus coding efficiency can be further improved.

Furthermore, the image coding method may further include coding the control signal.

Accordingly, since the control signal is coded, the signal coded according to the present coding method can be correctly decoded at the decoding side.

Furthermore, each of the high-order probability information and the low-order probability information may be an index indicating a value of a symbol occurrence probability.

Furthermore, each of the high-order probability information and the low-order probability information may be a value of a symbol occurrence probability.

Furthermore, the image decoding method according to an aspect of the present invention is an image decoding method for decoding coded image data, the image decoding method including: determining (i) a low-order context which is a context associated with a type of a signal to be decoded of the coded image data and (ii) a high-order context that is common to the low-order context and a context associated with another type; calculating decoding probability information to be used in arithmetic decoding of the signal to be decoded, using (i) high-order probability information corresponding to the determined high-order context and (ii) low-order probability information corresponding to the determined low-order context; performing the arithmetic decoding on the signal to be decoded, using the decoding probability information, to generate a binary signal; performing multi-value conversion of the binary signal to reconstruct image data; and updating the high-order probability information and the low-order probability information based on the binary signal.

Accordingly, by using a symbol occurrence probability that takes into consideration both overall statistical information according to a symbol occurrence probability of a high hierarchical level and detailed statistical information according to a symbol occurrence probability of a low hierarchical level, it possible to decode a coded stream generated under improved coding efficiency.

It should be noted that the present invention can be implemented, not only as an image coding method and an image decoding method, but also as an apparatus/apparatuses including processing units that execute the processing steps included in such the image coding method and the image decoding method. Furthermore, the present invention can also be implemented as a program which causes a computer to execute such steps. In addition, the present invention may also be implemented as a recoding medium such as a computer-readable Compact Disk-Read Only Memory (CD-ROM) on which such program is recorded, and as information, data, or a signal representing such program. In addition, such program, information, data and signal may be distributed via a communication network such as the Internet.

Furthermore, a part or all of the constituent elements included in each of the image coding apparatus and the image decoding apparatus described above may be configured as a single system LSI (Large Scale Integration). The system LSI is a super multi-functional LSI manufactured by integrating a plurality of structural units onto a single chip. Specifically, it is a computer system configured by including a microprocessor, a ROM, a Random Access Memory (RAM), and the like.

Advantageous Effects of Invention

The present invention is capable of performing prediction of symbol occurrence possibilities which high accuracy, and is thus capable of improving coding efficiency.

BRIEF DESCRIPTION OF DRAWINGS

FIG. 2 is a table showing an example of a symbol occurrence probability table according to Embodiment 1 of the present invention.

FIG. 3 is a table showing an example of a hierarchical context table according to Embodiment 1 of the present invention.

FIG. 9 is a table showing an example of a context updating table according to Embodiment 1 of the present invention.

DESCRIPTION OF EMBODIMENTS

Hereinafter, embodiments of the present invention shall be described with reference to the Drawings.

Embodiment 1

An outline of an arithmetic coding method according to this embodiment shall be described. The arithmetic coding method according to this embodiment uses, for the type of the signal which is to be the coding target, symbol occurrence probabilities having a hierarchical signal type classification structure. With this, it is possible to use a symbol occurrence probability that takes into consideration both overall statistical information according to a symbol occurrence probability of a high hierarchical level and detailed statistical information according to a symbol occurrence probability of a low hierarchical level, and thus makes it possible to improve coding efficiency.

The foregoing is the description of the outline of the arithmetic coding method according to this embodiment.

Figure 1:
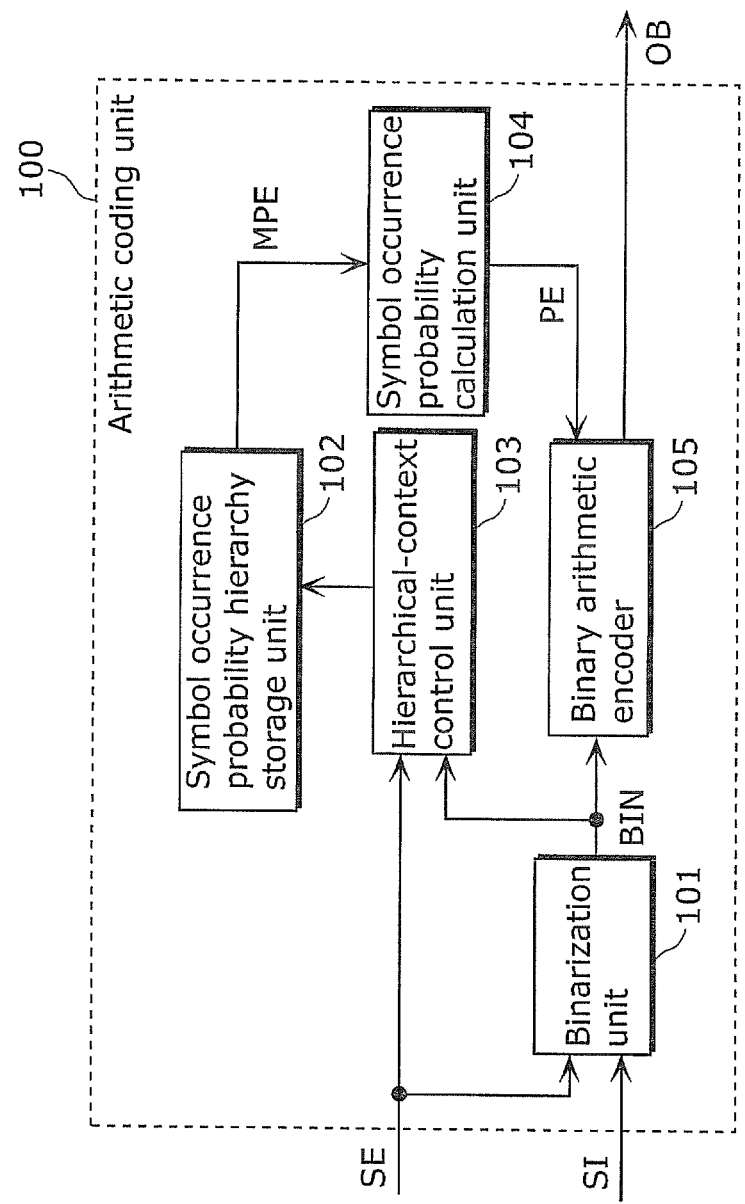
FIG. 1 is a block diagram showing an example of a configuration of an arithmetic coding unit according to Embodiment 1 of the present invention.

Next, a configuration of an arithmetic coding unit that performs the arithmetic coding method according to this embodiment shall be described. FIG. 1 is a block diagram showing an example of a configuration of an arithmetic coding unit 100 according to Embodiment 1 of the present invention. It should be noted that, as described later, the arithmetic coding unit 100 according to Embodiment 1 of the present invention corresponds to a part of an image coding apparatus that compression-codes image data.

As shown in FIG. 1, the arithmetic coding unit 100 includes a binarization unit 101, a symbol occurrence probability hierarchy storage unit 102, a hierarchical-context control unit 103, a symbol occurrence probability calculation unit 104, and a binary arithmetic encoder 105. The arithmetic coding unit 100 generates an output signal OB by performing arithmetic coding on the input signal SI which is the signal to be coded, and outputs the output signal OB. Furthermore, signal type information SE indicating the type of the input signal SE is inputted to the arithmetic coding unit 100.

It should be noted that the input signal SI is the signal to be coded of the image data, and is, for example, a signal indicating a quantized coefficient generated by the transformation and the quantization of the image data. It should be noted that that, instead of a quantized coefficient, the input signal SI may be information used for generating a quantized coefficient.

Furthermore, the signal type information SE is signal type information indicating the type of the input signal SI which is the signal to be coded. The signal type information SE is, for example, information indicating a property of the signal to be coded. When the prediction method applied to the input signal SI is intra prediction, the signal type information SE may be information indicating the prediction direction in the intra prediction.

Alternatively, when the input signal SI is one element of the quantized coefficients of a macroblock, the signal type information SE may be information indicating the coefficient position of the quantized coefficient. In addition, the signal type information SE may be information indicating whether the quantization coefficients around the target quantization coefficient are zero or non-zero. More specifically, when the input signal SI is a certain frequency component of the quantized coefficients of a macroblock, the signal type information SE may be information indicating whether the direct current component of the quantized coefficient of the macroblock is zero or non-zero.

The binarization unit 101 generates a binary signal by binarizing the signal to be coded. Specifically, the binarization unit 101 generates a binary signal BIN by performing the binarization of the input signal, based on the input signal SI and the signal type information SE.

The symbol occurrence probability hierarchy storage unit 102 is a memory or the like that holds the plural occurrence probabilities of a symbol. For example, the symbol occurrence probability hierarchy storage unit 102 holds a symbol occurrence probability table. The symbol occurrence probability table is a table in which contexts and probability information are associated. Details of the symbol occurrence probability table shall be described later.

Furthermore, the symbol occurrence probability hierarchy storage unit 102 holds a hierarchical context table. The hierarchical context table is a table in which types of signals to be coded and contexts are associated. Details of the hierarchical context table shall be described later.

The hierarchical-context control unit 103 determines a low-order context which is a context associated with the type of the signal to be coded, and a high-order context that is common to the low-order context and a context (another low-order context) associated with another type. Specifically, the hierarchical-context control unit 103 obtains the signal type information SE and, based on the obtained signal type information SE, refers to the hierarchical context table to thereby determine the context associated with the type of the signal to be coded. At this time, when the determined context is not hierarchized, the hierarchical-context control unit 103 determines one context, and, when the determined context is hierarchized, determines two or more contexts. It should be noted that the hierarchical-context control unit 103 may hold the hierarchical context table.

In addition, the hierarchical-context control unit 103 determines probability information corresponding to the determined contexts. In other words, the hierarchical-context control unit 103 determines high-order probability information corresponding to the high-order context and low-order probability information corresponding to the low-order context. Specifically, the hierarchical-context control unit 103 determines which symbol occurrence probability stored in the symbol occurrence probability hierarchy storage unit 102 is to be used, by referring to the symbol occurrence probability table.

The symbol occurrence probability calculation unit 104 obtains probability information corresponding to the context determined by the hierarchical-context control unit 103, and calculates coding probability information using the obtained probability information. The coding probability information is probability information used in the arithmetic coding of a binary signal. It should be noted that the probability information is an index indicating a value of a symbol occurrence probability or is a value of the symbol occurrence probability.

Specifically, the symbol occurrence probability calculation unit 104 reads, from the symbol occurrence probability hierarchy storage unit 102, the symbol occurrence probability corresponding to the context determined by the hierarchical-context control unit 103. Subsequently, the symbol occurrence probability calculation unit 104 calculates the symbol occurrence probability to be used in the arithmetic coding. The calculated symbol occurrence probability is outputted to the binary arithmetic encoder 105.

The binary arithmetic encoder 105 performs arithmetic coding on the binary signal, using the coding probability information. Specifically, the binary arithmetic encoder 105 performs arithmetic coding on the binary signal generated by the binarization unit 101, using the symbol occurrence probability outputted by the symbol occurrence probability calculation unit 104.

The foregoing is the description of the configuration of the arithmetic coding unit 100 according to this embodiment.

At this point, the symbol occurrence probability table held by the symbol occurrence probability hierarchy storage unit 102 shall be described. FIG. 2 is a table showing an example of the symbol occurrence probability table according to Embodiment 1 of the present invention.

The symbol occurrence probability table is a table in which contexts and symbol occurrence probabilities are associated. Index (ctxIdx) in FIG. 2 denotes indexes each indicating a context, and specifically denotes indexes that are determined according to surrounding information of the macroblock currently being coded, or already-coded information inside a block, or bit location at which coding is to be performed.

The entries indicated by each index include probability information (pStateIdx) indicating a symbol occurrence probability, and a symbol (valMPS) having the highest occurrence probability (Most Probable Symbol). These are the same as those indicated in the H.264 Standard. In other words, a pStateIdx is an index indicating the value of a symbol occurrence probability. The symbol occurrence probability hierarchy storage unit 102 further holds a table indicating values of symbol occurrence probabilities corresponding to the respective pStateIdx.

It should be noted that although management is performed here using a table in which the indices (pStateIdx) indicating symbol occurrence probabilities and the contexts (ctxIdx) are associated with one another, the contexts and the values of the symbol occurrence probabilities may be managed by being directly associated with each other. In this case, by representing the values of the symbol occurrence probabilities with, for example, 16-bit precision (0 to 65535), it is possible to handle more extensive values than when managing using the above-described table. As such, coding efficiency can be improved. From hereon, description shall be made using a method in which the symbol occurrence probabilities are managed as values.

Next, the hierarchical context table held by the symbol occurrence probability hierarchy storage unit 102 shall be described. FIG. 3 is a table showing an example of the hierarchical context table according to Embodiment 1 of the present invention.

The hierarchical context table is a table in which types and contexts are associated. As shown in FIG. 3, one or two contexts are associated for each type of signal to be coded. Specifically, when context associated with a certain type is not hierarchized, one context is associated with such type. Furthermore, when the context associated with a certain type is hierarchized, two contexts are associated with such type.

More specifically, when the context associated with a certain type is hierarchized, such context is hierarchized into a high-order context and a low-order context. The high-order context is a context that is common to plural types, and is equivalent to a broad classification when classifying the property of the signal to be coded. Stated differently, the high-order context is common to the low-order contexts associated with each of the plural types.

The low-order context is a context associated with each of the plural types, and is equivalent to a fine classification when classifying the property of the signal to be coded. In other words, the low-order context indicates a property to be classified under a condition satisfying the high-order context.

In the example shown in FIG. 3, when the signal type information SE is "4", the high-order context is "14" and the low-order context is "24". Furthermore, when the signal type information SE is "5", the high-order context is "14" and the low-order context is "25". In other words, in the example in FIG. 3, the context indicating "14" is a high-order context used in common for both the cases where the signal type information is "4" and "5".

As an example, when the signal to be coded is a quantized coefficient, the high-order context corresponds to the coefficient position (SE=4 or SE=5) of the quantized coefficient. The low-order context corresponds, for example, to the presence or absence of a coefficient around the quantized coefficient, that is, non-zero (SE=4) or zero (SE=5).

The hierarchical-context control unit 103, upon obtaining the signal type information SE, first refers to the hierarchical context table to thereby determine the context associated with the type of the signal to be coded. At this time, the hierarchical-context control unit 103 judges whether or not the context is hierarchized, based on the signal type information SE. The hierarchical-context control unit 103 determines the high-order context and the low-order context when the context is hierarchized, and determines one context when the context is not hierarchized.

Next, the hierarchical-context control unit 103 obtains the probability information corresponding to the determined context, by referring to the symbol occurrence probability table. When the context is hierarchized into the high-order context and the low-order context, the hierarchical-context control unit 103 determines high-order probability information corresponding to the high-order context and low-order probability information corresponding to the low-order context. When the context is not hierarchized, the hierarchical-context control unit 103 determines probability information corresponding to the determined context.

In this manner, it is possible to use a symbol occurrence probability that takes into consideration both overall statistical information according to the symbol occurrence probability of the high hierarchical level and detailed statistical information according to the symbol occurrence probability of the low hierarchical level. Therefore, coding efficiency can be improved.

Figure 4:
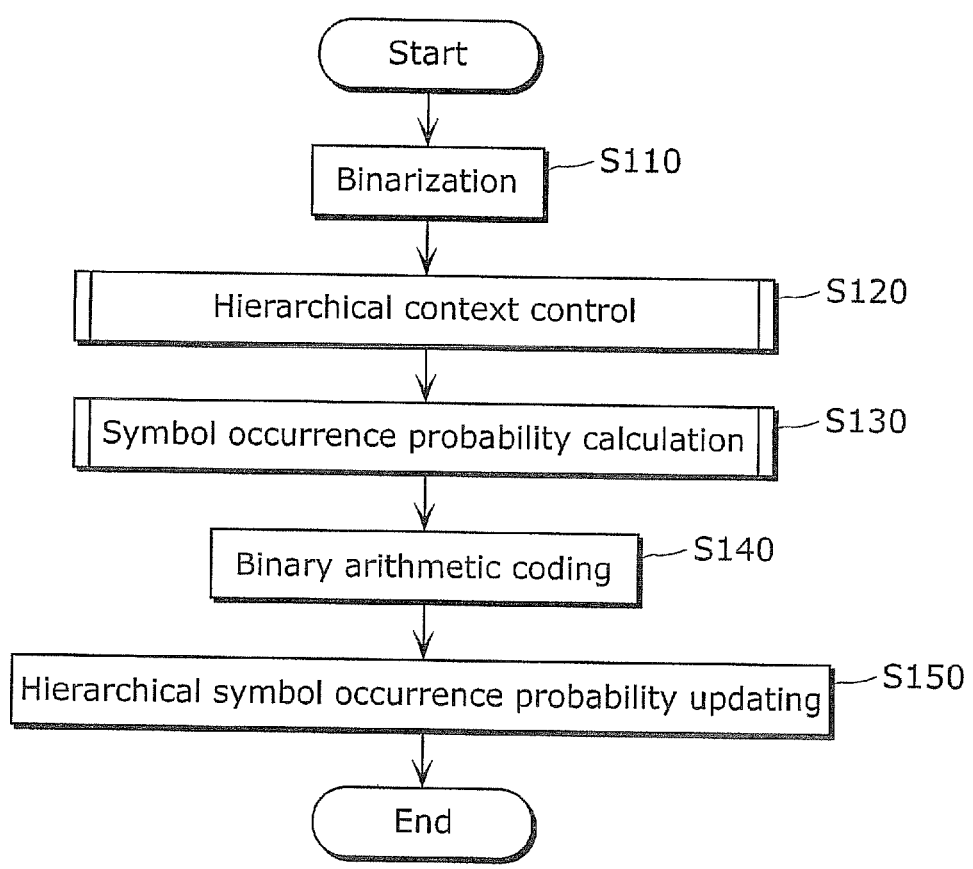
FIG. 4 is a flowchart showing an example of an arithmetic coding method according to Embodiment 1 of the present invention.

Next, the arithmetic coding method performed by the arithmetic coding unit 100 shown in FIG. 1 shall be described according to the flowchart shown in FIG. 4. FIG. 4 is a flowchart showing an example of the arithmetic coding method according to Embodiment 1 of the present invention. Furthermore, FIG. 4 shows arithmetic coding of one input signal (the signal to be coded). For example, one signal to be coded denotes one value of the quantized coefficients.

As shown in FIG. 4, in the arithmetic coding method according to this embodiment, first, the binarization unit 101 performs, on the input signal SI which is to be the coding target, binarization corresponding to the signal type information SE indicating the type of the input signal, to generate the binary signal BIN (S110). It should be noted that the signal type information SE includes information indicating the method of binarization. The Binarization is executed according to the H.264 Standard for example.

Next, the hierarchical-context control unit 103 determines the hierarchized context corresponding to the input signal SI, from among the hierarchized contexts held in the symbol occurrence probability hierarchy storage unit 102 (S120). Specifically, when the context associated with the type of the signal to be coded is hierarchized into a high-order context and a low-order context, the hierarchical-context control unit 103 selects the high-order probability information corresponding to the high-order context and one piece of low-order probability information corresponding to the low-order context among plural pieces of low-order probability information. It should be noted that details of the selection of probability information shall be described later.

Next, the symbol occurrence probability calculation unit 104 obtains the high-order probability information and the low-order probability information selected by the hierarchical-context control unit 103, and calculates, using the obtained high-order probability information and low-order probability information, the coding probability information to be used in the arithmetic coding of the binary signal (S130). Specifically, the symbol occurrence probability calculation unit 104 reads, from the symbol occurrence probability hierarchy storage unit 102, the symbol occurrence probabilities determined by the hierarchical-context control unit 103, and calculates the symbol occurrence probability to be used in the coding. It should be noted that details of the calculation of the symbol occurrence probability shall be described later.

The binary arithmetic encoder 105 performs arithmetic coding on the binary signal, using the coding probability information (S140). Specifically, the binary arithmetic encoder 105 performs arithmetic coding according to a method indicated in the H.264 Standard, on the binary signal from the binarization unit 101, and using the symbol occurrence probability calculated by the symbol occurrence probability calculation unit 104.

The hierarchical-context control unit 103 updates the high-order probability information and the low-order probability information, based on the binary signal generated by the binarization unit 101 (S150). Specifically, the hierarchical-context control unit 103 updates, according to a binary signal obtained from the binarization unit 101, the symbol occurrence probabilities corresponding to the hierarchized context held in the symbol occurrence probability hierarchy storage unit 102. It should be noted that details of the updating shall be described later.

Figure 5:
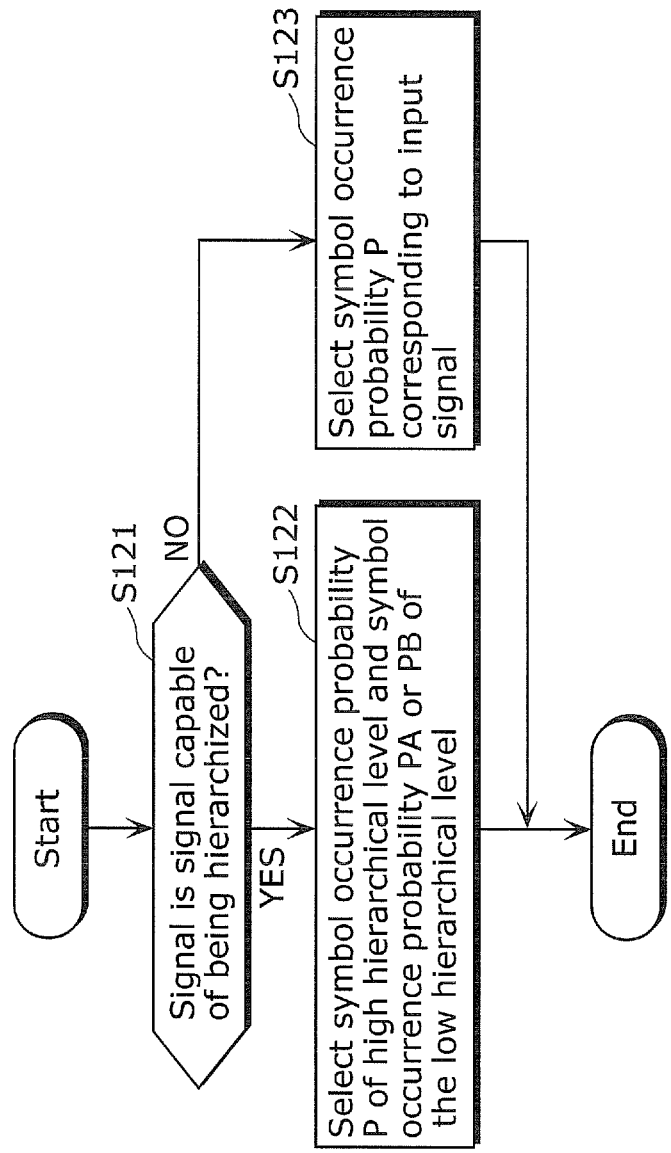
FIG. 5 is a flowchart showing an example of hierarchical-context control according to Embodiment 1 of the present invention.

Next, the hierarchical-context control (S120) in FIG. 4 shall be described using FIG. 5. FIG. 5 is a flowchart showing an example of the hierarchical-context control according to Embodiment 1 of the present invention.

The hierarchical-context control unit 103 judges, according to the signal type information SE indicating the type of the input signal SI which is to be the coding target, whether or not the input signal SI is a signal that can be hierarchized (S121). Specifically, the hierarchical-context control unit 103 judges whether or not the context associated with the type of the input signal SI is hierarchized. The judgment criterion is predetermined and a specific example thereof shall be described later.

When hierarchizing is possible (Yes in S121), the hierarchical-context control unit 103 selects, from the symbol occurrence probability hierarchy storage unit 102, a symbol occurrence probability P of the high hierarchical level and a symbol occurrence probability PA or PB of the low hierarchical level, and sends the selected symbol occurrence probabilities to the symbol occurrence probability calculation unit 104 (S122). On the other hand, when hierarchizing is not possible (No in S121), the hierarchical-context control unit 103 selects, from the symbol occurrence probability hierarchy storage unit 102, the symbol occurrence probability P corresponding to the input signal SI, and sends the symbol occurrence probability P to the symbol occurrence probability calculation unit 104 (S123).

Here, the method of judging, according to the signal type information SE indicating the type of the input signal SI which is to be the coding target, whether or not the input signal SI can be hierarchized (S121) shall be described.

The hierarchical-context control unit 103 judges whether or not hierarchization is possible, using predetermined types.

For example, in H.264, prediction coding is used. Although different symbol occurrence probabilities are defined depending on the method of creating the prediction image in prediction coding in H.264 (see NPL 1), finer division is also possible. By assuming predefined symbol occurrence probabilities for the high hierarchical level and assuming parts that can be more finely divided for the low hierarchical level, prediction accuracy of the symbol occurrence probability implemented according to H.264 can be improved, and thus coding efficiency can be improved.

As an example, when high-order probability information corresponding to a broad classification (high hierarchical level) of whether or not the prediction method applied to the input signal is intra prediction or inter prediction is defined, it is possible to further define pieces of low-order probability information corresponding to fine classifications (low hierarchical level) under the broad classification. In the fine classifications, it is possible to perform classification using, for example, the prediction directions in intra prediction. In other words, it is possible to define pieces of low-order probability information corresponding to the respective prediction directions in intra prediction.

As another example, in H.264, residual data is created from the difference between the prediction image and image data, quantized coefficients are generated by performing frequency transform and quantization on the residual data, and binarization and arithmetic coding is performed on the quantized coefficients (see NPL 1). At this point, different symbol occurrence probabilities are defined according to coefficient position, but these can be further divided.

For example, when dividing by the two conditions of the presence or absence of surrounding coefficients, there is a possibility that the symbol occurrence probabilities of the coefficient which is to be the coding target will differ significantly from one another according to the respective conditions. As such, the contexts are divided in the high hierarchical level according to a condition such as the coefficient position, and further divided in the low hierarchical level according to the presence or absence of a surrounding coefficient. With this, the prediction accuracy of symbol occurrence probabilities implemented according to H.264 can be improved, and thus coding efficiency can be improved.

Figures 6, 7:
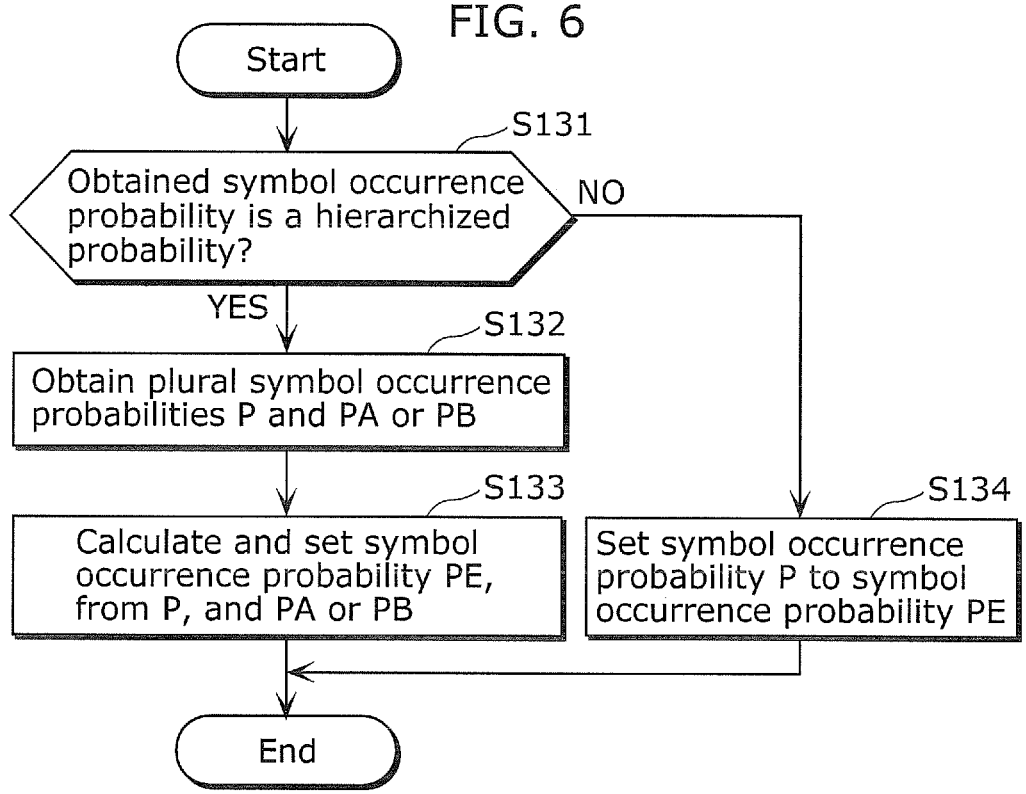
FIG. 6 is a flowchart showing an example of symbol occurrence probability calculation according to Embodiment 1 of the present invention.
FIG. 7 is a diagram showing an example of symbol occurrence probability tables according to Embodiment 1 of the present invention.

Next, the symbol occurrence probability calculation (S130) in FIG. 4 shall be described using FIG. 6. FIG. 6 is a flowchart showing an example of the symbol occurrence probability calculation according to Embodiment 1 of the present invention.

The symbol occurrence probability calculation unit 104 judges whether or not the symbol occurrence probability determined by the hierarchical-context control unit 103 is hierarchized (S131). When it is a hierarchized probability (Yes in S131), the symbol occurrence probability calculation unit 104 obtains plural symbol occurrence probabilities P and PA or PB (S132). Specifically, the symbol occurrence probability calculation unit 104 obtains the symbol occurrence probability P equivalent to the high hierarchical level and the symbol occurrence probability PA or PB equivalent to the low hierarchical level. It should be noted that whether the symbol occurrence probability PA or PB is to be obtained is determined by the hierarchical-context control unit 103 using the signal type information SE. Next, the symbol occurrence probability calculation unit 104 calculates a symbol occurrence probability PE to be used in arithmetic coding, from the obtained symbol occurrence probabilities P and PA or PB, and sends the calculated symbol occurrence probability PE to the binary arithmetic encoder 105 (S133).

On the other hand, when the symbol occurrence probability determined by the hierarchical-context control unit 103 is a probability that is not hierarchized (No in S131), the symbol occurrence probability calculation unit 104 sends the obtained symbol occurrence probability P, as the symbol occurrence probability PE, to the binary arithmetic encoder 105 (S134).

Here, when signal type information that can be hierarchized is denoted as A or B, respective corresponding symbol occurrence probabilities of the low hierarchical level are denoted as PA and PB, and a symbol occurrence probability (symbol occurrence probability of the high hierarchical level) corresponding to both cases of the signal type information being A and the signal type information being B is denoted as P, the method of calculating the symbol occurrence probability PE to be used in the arithmetic coding is represented by Formula 1.

| (Formula 1) |
|---|
| if (SE==A){<br>    PE=P+(PA−P)*factor;<br>}<br>else if (SE==B){<br>    PE=P+(PB−P)*factor;<br>} |

As shown in Formula 1, when the signal type information is A, the symbol occurrence probability calculation unit 104 calculates the symbol occurrence probability PE to be used in arithmetic coding, according to the weighted sum of the symbol occurrence probability P of the high hierarchical level and the symbol occurrence probability PA of the low hierarchical level.

Here, factor is an example of a control signal used in calculating coding probability information, and is a predetermined control parameter. The factor is from 0 to 1. When the factor is 0, this indicates that the common symbol occurrence probability P is used for the signal type A and the signal type B. On the other hand, when the factor is 1, this indicates that the always-independent symbol occurrence probability PA or PB is used. This control parameter enables the assigning of weights according to the signal type and thus enables the implementation of further coding efficiency improvement.

The above-described control parameter may be transmitted separately through a coded stream. In other words, the control signal to be used in calculating the coding probability information may be coded. By doing so, control of symbol occurrence probabilities according to the features of each image becomes possible, and thus further improvement of coding efficiency is realized.

On the other hand, decimal calculation becomes necessary with the factor shown in Formula 1, and when mounting onto a circuit, program speed, and so on are taken into consideration, integer calculation or shift calculation is preferable. In view of this, a method of calculating PE which considers the amount of computation is represented by Formula 2.

| (Formula 2) |
|---|
| if (SE==A){<br>    PE=P+((PA−P)*fx)>>fy;<br>}<br>else if (SE==B){<br>    PE=P+((PB−P)*fx)>>fy;<br>} |

As shown in Formula 2, by dividing the control parameter into fx and fy, the need for decimal calculation is eliminated and the amount of computation can be reduced.

The foregoing description describes an example in which a high hierarchical level is divided into two types based on the signal type information SE. In other words, the foregoing describes an example in which two low hierarchical levels exist with respect to one high hierarchical level. In contrast, Formula 3 shows that the same calculation is possible even when the number of low hierarchical levels is three or more.

(Formula 3)

```
if (SE==A){
    PE=P+(PA−P)*factor;
}
else if (SE==B){
    PE=P+(PB−P)*factor;
}
else if (SE==C){
    PE=P+(PC−P)*factor;
}
```

As shown in Formula 3, by obtaining, from the signal type information SE, the symbol occurrence probabilities (PA, PB, P) corresponding to the hierarchized conditions (A, B, C) and performing calculation as shown in Formula 3, the same calculation is possible even for three or more types.

It should be noted that the symbol occurrence probability PE to be used in arithmetic coding may be calculated by table referencing, instead of performing calculations such as those described above. For example, the symbol occurrence probability calculation unit 104 holds symbol occurrence probability calculation tables such as those shown in FIG. 7.

The symbol occurrence probability calculation table is a table in which the symbol occurrence probabilities P, PA, and PB, and the symbol occurrence probability PE to be used in arithmetic coding are associated. The symbol occurrence probability calculation unit 104 holds plural symbol occurrence probability calculation tables, and can switch tables to be referred to according to the control parameter F. Stated differently, the symbol occurrence probability calculation tables correspond to the respective control parameters F.

Subsequently, the symbol occurrence probability calculation unit 104 derives the PE according to Formula 4.

(Formula 4)

```
if (SE==A){
    PE=estimatePE[P][PA][F]
}
else if (SE==B){
    PE=estimatePE[P][PB][F]
}
```

As shown in Formula 4, the symbol occurrence probability calculation unit 104 calculates the symbol occurrence probability PE to be used in arithmetic coding with reference to the symbol occurrence probability calculation table, based on the control parameter F and the obtained symbol occurrence probabilities P and PA or PB. With this, it becomes possible to suppress the number of calculations.

Next, an example of the method of updating the symbol occurrence probability shall be described using Formula 5. The hierarchical-context control unit 103 updates, according to the binary signal obtained from the binarization unit 101, the symbol occurrence probability of the hierarchized context held in the symbol occurrence probability hierarchy storage unit 102 and which corresponds to the input signal SI.

(Formula 5)

```
if (SE==A){
    if (bin==0){
        PA=PA+(1−PA)*fu;
        P =P +(1−P)*fu;
    }
    else {
        PA=PA−PA*fu;
        P =P−P*fu;
    }
}
if (SE==B){
    if (bin==0){
        PB=PB+(1−PB)*fu;
        P =P +(1−P)*fu;
    }
    else {
        PB=PB−PB*fu;
        P =P−P*fu;
    }
}
```

As shown in Formula 5, when the signal type information SE is A, each of the symbol occurrence probability P of the high hierarchical level and the symbol occurrence probability PA of the low hierarchical level are calculated according to the update parameter fu, for the binarized binary information (BIN) to be coded. It should be noted that the symbol occurrence probabilities shown in Formula 5 denote symbol occurrence probabilities when valMPS=0. Therefore, in Formula 5, values are updated to increase both the symbol occurrence probabilities P and PA (or PB) when BIN=0, and values are updated to reduce both the symbol occurrence probabilities P and PA (or PB) when BIN=1.

It should be noted that the symbol occurrence probabilities P, PA, and PB are probabilities represented by decimal numbers having a value from 0 to 1. It should be noted that, as described earlier, these probabilities may be expressed like the symbol occurrence probability table, and may be expressed as a value from 0 to 65536 (16 bits). In this case, the formula for updating changes depending on the expression method. However, the values used in updating may be different than those in Formula 5 as long as the symbol occurrence probability P of the high hierarchical level and the symbol occurrence probability PA (or PB) of the low hierarchical level are updated in the same manner.

On the other hand, in the same manner as shown in Formula 2, integer calculation or shift calculation can be set as the updating parameter. Furthermore, in the same manner as shown in Formula 3, the same updating for three or more types becomes possible. Furthermore, in the same manner as shown in Formula 4, table referencing can be performed instead of calculation.

Figure 8:
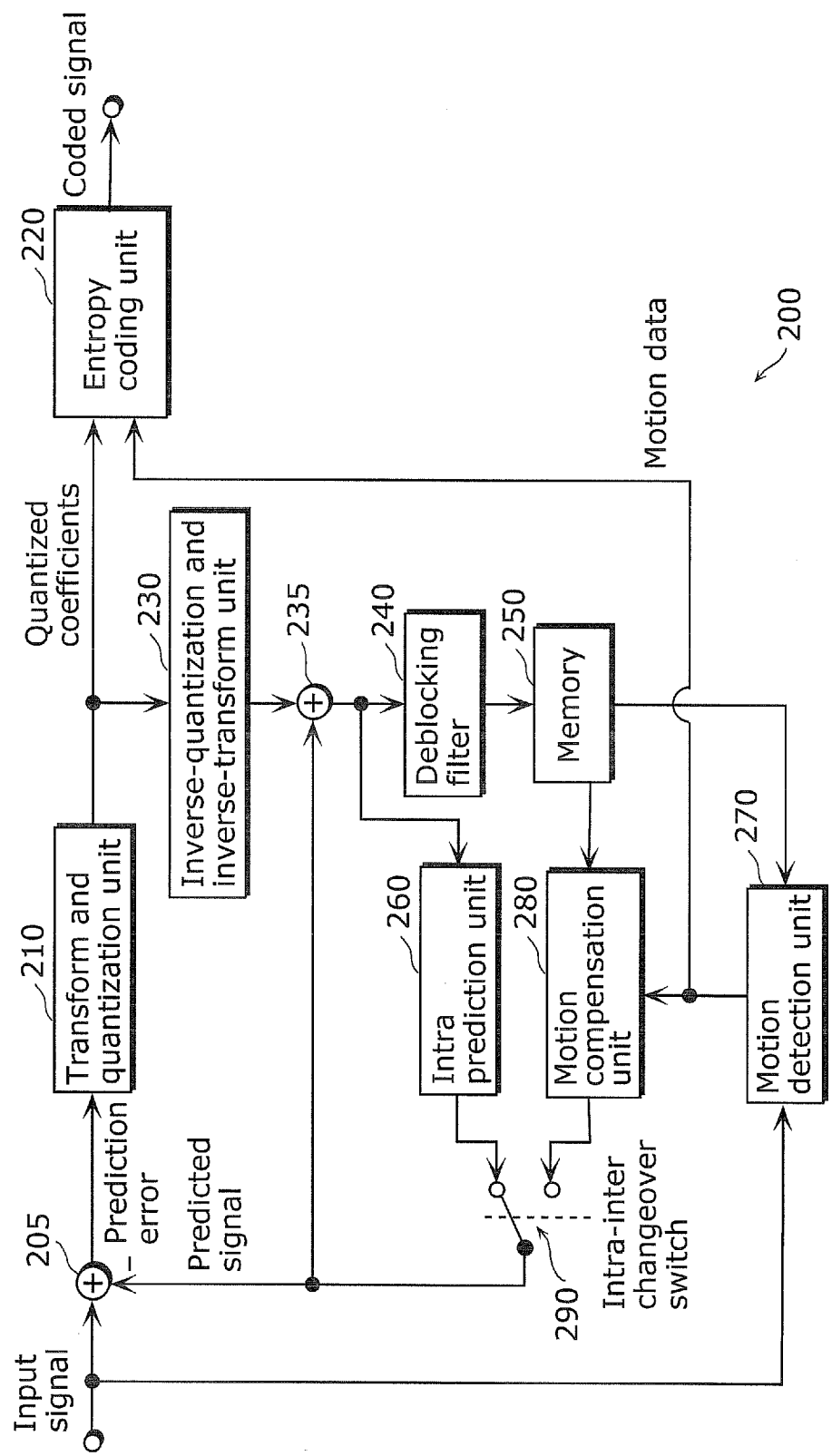
FIG. 8 is a block diagram showing an example of a configuration of an image coding apparatus according to Embodiment 1 of the present invention.

It should be noted that the arithmetic coding unit 100 according to Embodiment 1 of the present invention is included in an image coding apparatus that performs compression-coding of image data. FIG. 8 is a block diagram showing an example of a configuration of an image coding apparatus 200 according to Embodiment 1 of the present invention.

The image coding apparatus 200 compression-codes image data. For example, image data is inputted, to the image coding apparatus 200, on a per block basis as an input signal. The image coding apparatus 200 performs transformation, quantization, and variable-length coding on the inputted input signal to generate a coded signal.

As shown in FIG. 8, the image coding apparatus 200 includes a subtractor 205, a transform and quantization unit 210, an entropy coding unit 220, an inverse-quantization and inverse-transform unit 230, an adder 235, a deblocking filter 240, a memory 250, an intra prediction unit 260, a motion detection unit 270, a motion compensation unit 280, and an intra-inter changeover switch 290.

The subtractor 205 calculates the difference, that is, the prediction error, between an input signal and a predicted signal.

The transform and quantization unit 210 transforms the prediction error in the spatial domain to generate transformed coefficients in a frequency domain. For example, the transform and quantization unit 210 generates the transformed coefficients by performing discreet cosine transform (DCT) on the prediction error. In addition, the transform and quantization unit 210 quantizes the transformed coefficients to generate quantized coefficients.

The entropy coding unit 220 performs variable-length coding on the quantized coefficients to generate a coded signal. Furthermore, the entropy coding unit 220 codes motion data (for example, a motion vector) detected by the motion detection unit 270, and outputs the result by including it in the coded signal.

The inverse-quantization and inverse-transform unit 230 inverse-quantizes the quantized coefficients to reconstruct the transformed coefficients. In addition, the inverse-quantization and inverse-transform unit 230 inverse-transforms the reconstructed transformed coefficients to reconstruct the prediction error. It should be noted that since information is lost due to quantization, the reconstructed prediction error does not match the prediction error generated by the subtractor 205. In other words, the reconstructed prediction error includes a quantization error.

The adder 235 adds up the reconstructed prediction error and the predicted signal to generate a local decoded image.

The deblocking filter 240 performs deblocking filtering processing on the generated local decoded image.

The memory 250 is a memory for storing a reference image to be used in motion compensation. Specifically, the memory 250 stores a local decoded image on which the deblocking filtering processing has been performed.

The intra prediction unit 260 performs intra prediction to generate a predicted signal (intra predicted signal). Specifically, the intra prediction unit 260 generates an intra predicted signal by performing intra prediction with reference to an image located around the block (input signal) to be coded in the local decoded image generated by the adder 235.

The motion detection unit 270 detects motion data (for example, a motion vector) between the input signal and the reference image stored in the memory 250.

The motion compensation unit 280 performs motion compensation based on the detected motion data, to generate a predicted signal (inter predicted signal).

The intra-inter changeover switch 290 selects either the intra predicted signal or the inter predicted signal, and outputs the selected signal as the predicted signal, to the subtractor 205 and the adder 235.

With the above described configuration, the image coding apparatus 200 according to Embodiment 1 of the present invention performs compression-coding of image data.

It should be noted that, in FIG. 8, the arithmetic coding unit 100 according to Embodiment 1 of the present invention is included in the entropy coding unit 220. In other words, the arithmetic coding unit 100 performs binarization and arithmetic coding on the quantized coefficient as the input signal SI. Furthermore, the signal type information SE is information indicating the coefficient position of the quantized coefficient, the motion data shown in FIG. 8, the intra prediction direction to be used by the intra prediction unit 260, or the like.

As described above, according to the image coding apparatus and image coding method according to Embodiment 1 of the present invention, when context that is associated with the type of the signal to be coded is hierarchized into a high-order context and a low-order context, the coding probability information to be used in arithmetic coding is calculated using high-order probability information corresponding to the high-order context and low-order probability information corresponding to the low-order context. In addition, both the high-order probability information and the low-order probability information are updated based on a binary signal which is a signal generated by binarizing the signal to be coded.

With this, it is possible to use, as the coding probability information, probability information that takes into consideration both the overall statistical information according to probability information of the high hierarchical level and detailed statistical information according probability information of the low hierarchical level, and thus coding efficiency can be improved. Specifically, since it is possible to suppress the deterioration of the updating frequency of high-order probability information which is equivalent to a large classification, arithmetic coding adapted to the features of the image data can be performed, and thus coding efficiency can be improved. Furthermore, since low-order probability information which is equivalent to a small classification is used, it is possible to improve the possibility of the prediction of the symbol occurrence probability coming true, and thus coding efficiency can be improved.

Furthermore, as shown in FIG. 8, when the arithmetic coding according to Embodiment 1 of the present invention is applied to an image coding apparatus and image coding method which use prediction, prediction of probability information that is in accordance with the features of the prediction method becomes possible, and thus coding efficiency can be further improved.

It should be noted that although an example in which values of probability information are managed is described in the foregoing embodiment, probability information may be managed using a table. An example of this shall be described using FIG. 9 and Formula 6. Here, FIG. 9 is a table showing an example of a context updating table according to a modification of Embodiment 1 of the present invention.

The hierarchical-context control unit 103 holds, for example, a context updating table such as that shown in FIG. 9. Then, the hierarchical-context control unit 103 updates the probability information by updating the index corresponding to the probability information (symbol occurrence probability) with reference to the context updating table in accordance with Formula 6.

The symbol occurrence probabilities shown in Formula 6 denote symbol occurrence probabilities when valMPS=0. Furthermore, each of the symbol occurrence probabilities P, PA, and PB are represented as P=pStateIdxP, PA=pStateIdxPA, and PB=pStateIdxPB.

(Formula 6)

```
if (SE==A){
    if (bin==0){
        PA=transIdxMPS[pStateIdxPA];
        P =transIdxMPS[pStateIdxP ];
    }
```

(Formula 6)

```
        else{
            PA=transIdxLPS[pStateIdxPA];
            P =transIdxLPS[pStateIdxP ];
        }
    }
    if (SE==B){
        if (bin==0){
            PB=transIdxMPS[pStateIdxPB];
            P =transIdxMPS[pStateIdxP ];
        }
        else{
            PB=transIdxLPS[pStateIdxPB];
            P =transIdxLPS[pStateIdxP ];
        }
    }
```

As an example, description shall be carried out for the case where the signal type information SE is A and the symbol of the coded binary signal BIN is 0. For example, when the symbol occurrence probability PA=pStateIdxPA prior to updating is "8" in FIG. 9 and P=pStateIdxP is "17" in FIG. 9, the symbol occurrence probability PA is updated to "9" and P to "18" by referring to the table shown in FIG. 9 in accordance with Formula 6.

In this manner, probability information can be updated by using the context updating table.

It should be noted that although the hierarchical level of the contexts and probability information is described as the two hierarchical levels of high-order and low-order in the foregoing embodiment, it is possible to have hierarchization with three hierarchical levels or more. In this case, in the hierarchical context table shown in FIG. 3, three or more contexts are associated with one type. Furthermore, when calculating coding probability information from three or more pieces of probability information, it is likewise possible to use weighted sums. Furthermore, by also preparing a table for three or more contexts, the number of calculations can be reduced through table referencing.

Embodiment 2

The outline of an arithmetic decoding method according to this embodiment shall be described. The arithmetic decoding method according to this embodiment uses symbol occurrence probabilities having a hierarchical signal type classification structure with respect to the type of the signal which is to be the decoding target, and thus it is possible to use symbol occurrence probabilities that take into consideration both the overall statistical information according to a symbol occurrence probability of a high hierarchical level and detailed statistical information according to a symbol occurrence probability of a low hierarchical level, and it is possible to decode a signal generated under improved coding efficiency.

The foregoing is the description of the outline of an arithmetic decoding method according to this embodiment.

Figure 10:
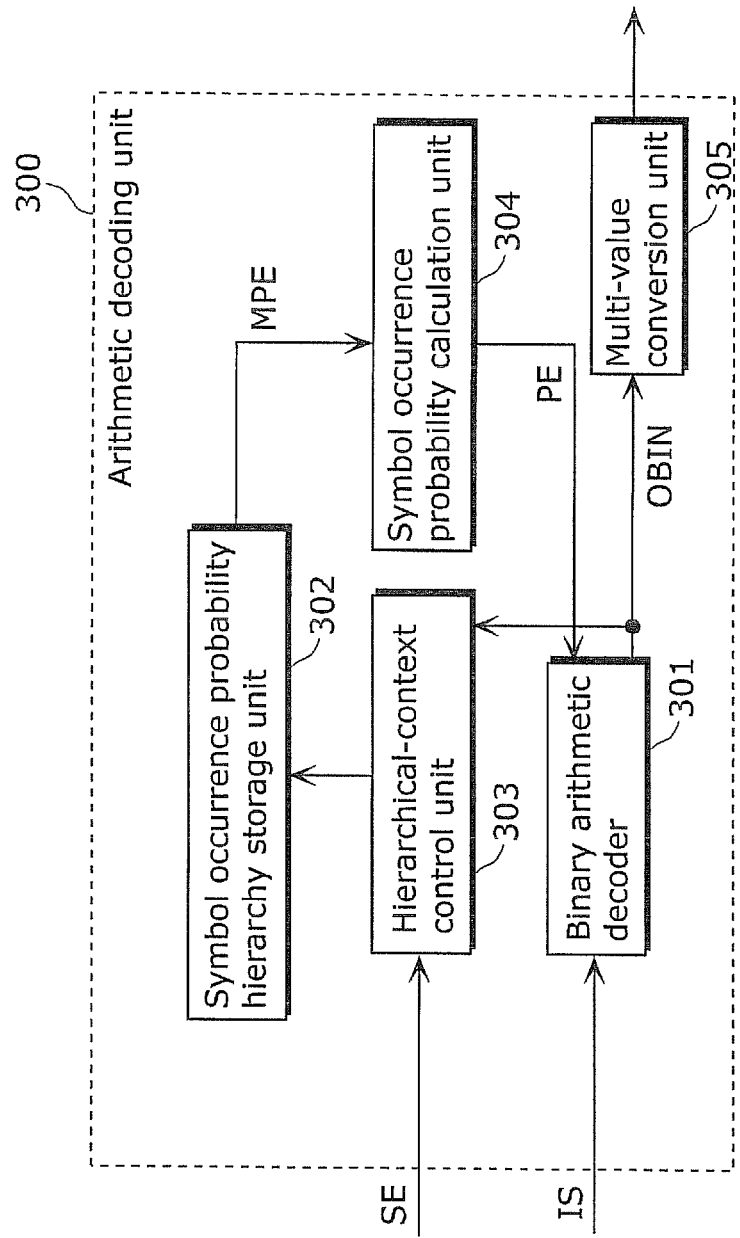
FIG. 10 is a block diagram showing an example of a configuration of an arithmetic decoding unit according to Embodiment 2 of the present invention.

Next, a configuration of an arithmetic decoding unit that performs the arithmetic decoding method according to this embodiment shall be described. FIG. 10 is a block diagram showing an example of a configuration of an arithmetic decoding unit 300 according to Embodiment 2 of the present invention. It should be noted that, as described later, the arithmetic decoding unit 300 according to Embodiment 2 of the present invention corresponds to a part of an image decoding apparatus that decodes coded image data generated by compression-coding.

As shown in FIG. 10, the arithmetic decoding unit 300 includes a binary arithmetic decoder 301, a symbol occurrence probability hierarchy storage unit 302, a hierarchical-context control unit 303, a symbol occurrence probability calculation unit 304, and a multi-value conversion unit 305. The arithmetic decoding unit 300 performs arithmetic decoding on the input stream IS which is the signal to be decoded, to reconstruct and output image data. Furthermore, signal type information SE indicating the type of the input stream IS is inputted to the arithmetic decoding unit 300.

The input stream IS is the signal to be decoded of the coded image data, and is, for example, a signal indicating quantized coefficients generated through the compression-coding of the image data. In other words, the input stream IS is equivalent to the signal generated through the arithmetic coding of the input signal SI according to Embodiment 1.

The signal type information SE is an example of type information of the signal to be decoded of the coded image data. Specifically, the signal type information SE is information indicating the type of the input stream IS, and is, more specifically, the same as the input type information SE according to Embodiment 1.

The binary arithmetic decoder 301 performs arithmetic decoding on the signal to be decoded, using decoding probability information, to generate a binary signal. Specifically, the binary arithmetic decoder 301 performs arithmetic decoding on the input stream IS using the symbol occurrence probability outputted by the symbol occurrence probability calculation unit 304, to generate an output binary signal OBIN.

The symbol occurrence probability hierarchy storage unit 302 is a memory and the like for holding occurrence probabilities of a symbol. For example, the symbol occurrence probability hierarchy storage unit 302 holds a symbol occurrence probability table. The symbol occurrence probability table is a table in which contexts and probability information are associated, and is, for example, the table shown in FIG. 2. Details of the symbol occurrence probability table are the same as in Embodiment 1.

For example, the symbol occurrence probability hierarchy storage unit 302 holds a hierarchical context table. The hierarchical context table is a table in which the types of signals to be decoded and contexts are associated, and is, for example, the table shown in FIG. 3. Details of the hierarchical context table are the same as in Embodiment 1.

The hierarchical-context control unit 303 determines a low-order context which is a context associated with the type of the signal to be coded, and a high-order context that is common to the low-order context and a context (another low-order context) associated with another type. Specifically, the hierarchical-context control unit 303 obtains the signal type information indicating the type of the input stream IS, and, based on the obtained signal type information SE, refers to the hierarchical context table to thereby determine the context associated with the type of the signal. At this time, the hierarchical-context control unit 303 determines one context when the determined context is not hierarchized, and determines two or more contexts when such determined context is hierarchized. It should be noted that the hierarchical-context control unit 303 may hold the hierarchical context table.

In addition, the hierarchical-context control unit 303 determines probability information corresponding to the determined context. Specifically, the hierarchical-context control unit 303 determines high-order probability information corresponding to the high-order context and low-order probability information corresponding to the low-order context. Specifically, the hierarchical-context control unit 303 determines which of the symbol occurrence probabilities stored in the symbol occurrence probability hierarchy storage unit 302 to use, by referring to the symbol occurrence probability table. The specific operation of the hierarchical-context control unit 303 is the same as that of the hierarchical-context control unit 103 according to Embodiment 1.

The symbol occurrence probability calculation unit 304 reads, from the symbol occurrence probability hierarchy storage unit 302, the symbol occurrence probability corresponding to the contexts determined by the hierarchical-context control unit 303. Subsequently, the symbol occurrence probability calculation unit 304 calculates the symbol occurrence probability to be used in arithmetic coding. The calculated symbol occurrence probability is outputted to the binary arithmetic decoder 301. The specific operation of the symbol occurrence probability calculation unit 304 is the same as that of the symbol occurrence probability calculation unit 104 according to Embodiment 1.

The multi-value conversion unit 305 performs multi-value conversion of the output binary signal OBIN generated by the binary arithmetic decoder 301, to reconstruct the image data. It should be noted that the method for multi-value conversion is determined based on the signal type information SE.

The foregoing is the description of the configuration of the arithmetic decoding unit 300 according to this embodiment.

Figure 11:
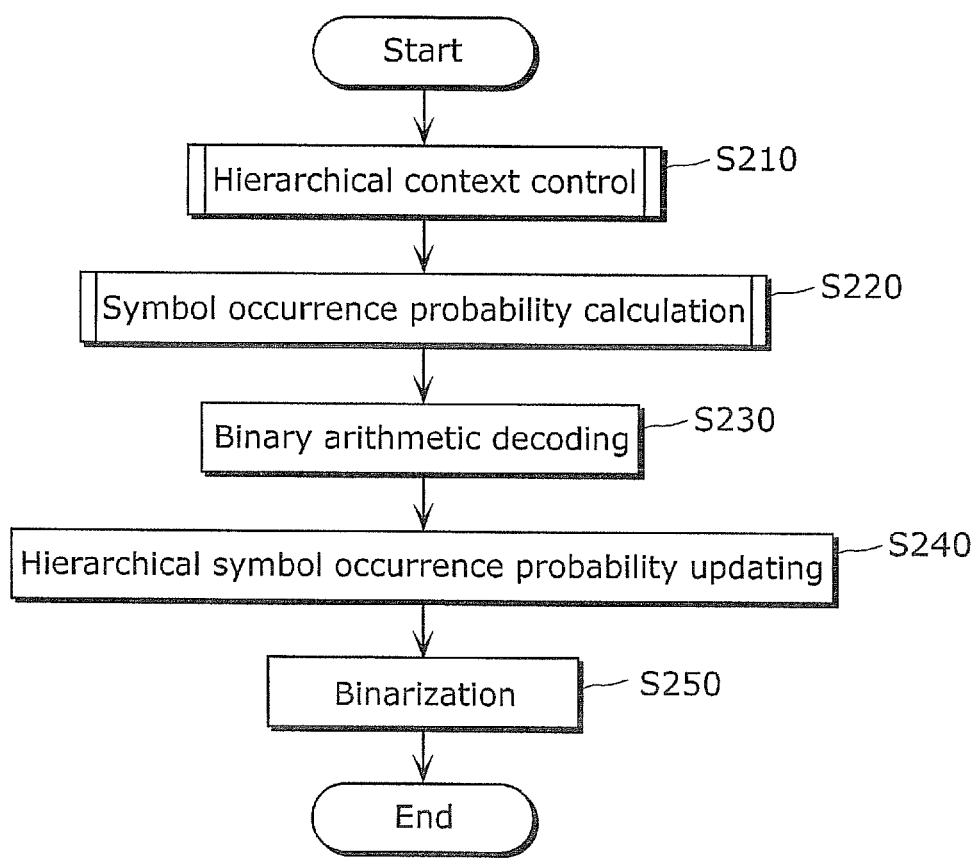
FIG. 11 is a flowchart showing an example of an arithmetic decoding method according to Embodiment 2 of the present invention.

Next, the arithmetic decoding method performed by the arithmetic decoding unit 300 shown in FIG. 10 shall be described according to the flowchart shown in FIG. 11. FIG. 11 is a flowchart showing an example of the arithmetic decoding method according to Embodiment 2 of the present invention. Furthermore, FIG. 11 shows the arithmetic decoding of one signal to be decoded. For example, one signal to be decoded denotes one value of the quantized coefficients.

As shown in FIG. 11, in the arithmetic decoding method in this embodiment, first, the hierarchical-context control unit 303 determines the hierarchized context corresponding to the signal to be decoded (input stream IS), from among the hierarchized contexts held in the symbol occurrence probability hierarchy storage unit 302 (S210). The determination method here is performed in the same manner as the context determination method at the time of coding (S120) according to Embodiment 1.

Next, the symbol occurrence probability calculation unit 304 obtains the high-order probability information and the low-order probability information determined by the hierarchical-context control unit 303, and calculates, using the obtained high-order probability information and low-order probability information, the decoding probability information to be used in the arithmetic decoding (S220). Specifically, the symbol occurrence probability calculation unit 304 reads, from the symbol occurrence probability hierarchy storage unit 302, the symbol occurrence probabilities determined by the hierarchical-context control unit 303, and calculates the symbol occurrence probability to be used in the arithmetic decoding. It should be noted that the details of the symbol occurrence probability calculation are performed in the same manner as the symbol occurrence probability calculation at the time of coding (S130) according to Embodiment 1.

The binary arithmetic decoder 301 performs arithmetic decoding on the signal to be decoded, using decoding probability information, to generate the output binary signal OBIN (S230). Specifically, the binary arithmetic decoder 301 performs arithmetic decoding according to a method indicated in the H.264 Standard, based on the symbol occurrence probability calculated by the symbol occurrence probability calculation unit 304.

The hierarchical-context control unit 303 updates the high-order probability information and the low-order probability information, based on the output binary signal OBIN (S240). Specifically, the hierarchical-context control unit 303 updates, according to the output binary signal OBIN generated by the binary arithmetic decoder 301, the symbol occurrence probabilities of the hierarchized context stored in the symbol occurrence probability hierarchy storage unit 302. The updating method is performed in the same manner as the hierarchized symbol occurrence probability updating method at the time of coding (S150) according to Embodiment 1.

The multi-value conversion unit 305 performs multi-value conversion of the output binary signal OBIN to reconstruct the image data (S250).

By adopting the above-described method, it is possible to decode a coded signal generated under improved coding efficiency.

Figure 12:
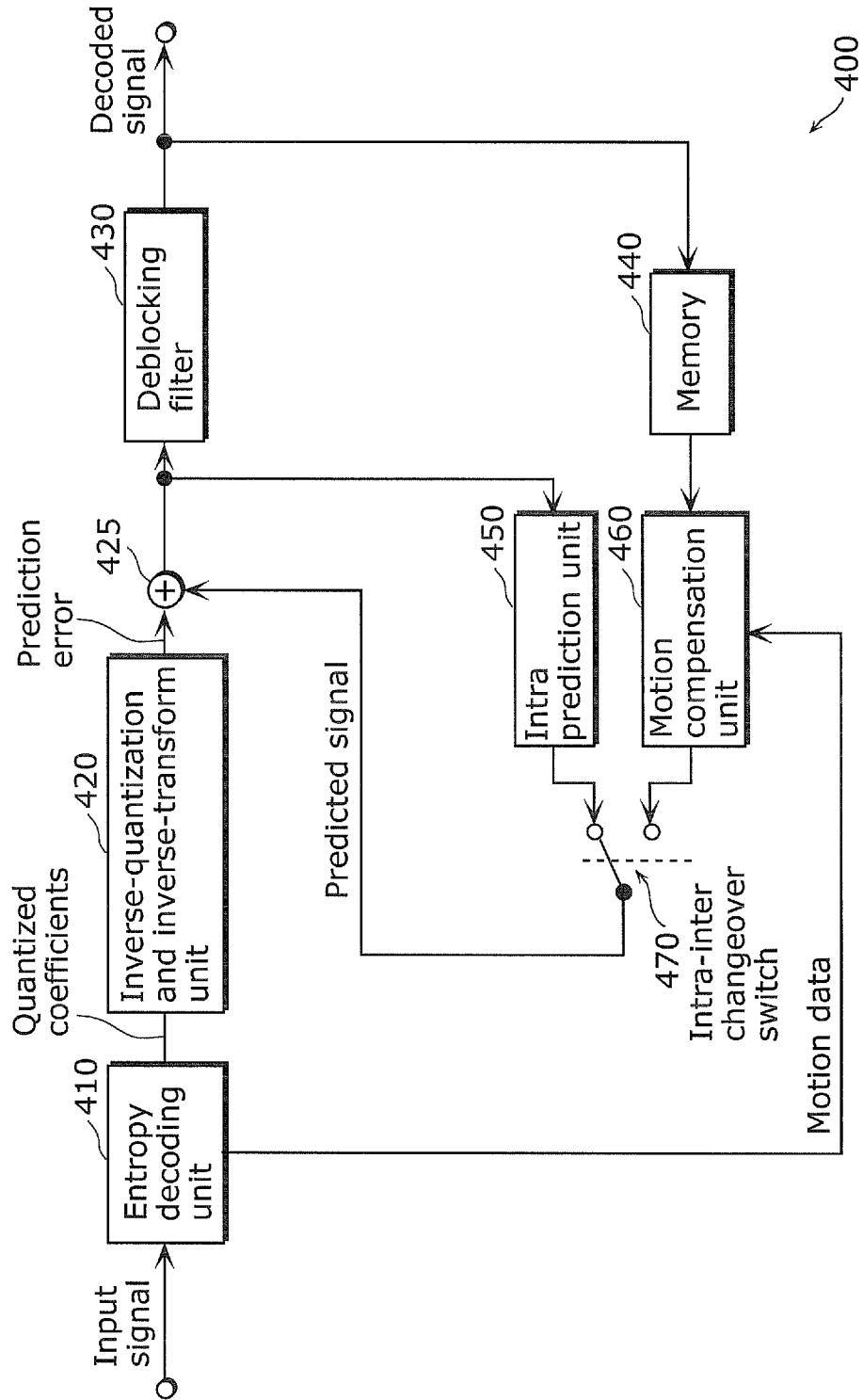
FIG. 12 is a block diagram showing an example of a configuration of an image decoding apparatus according to Embodiment 2 of the present invention.

It should be noted that the arithmetic decoding unit 300 according to Embodiment 2 of the present invention is included in an image decoding apparatus that decodes coded image data generated by compression-coding. FIG. 12 is a block diagram showing an example of a configuration of an image decoding apparatus 400 according to Embodiment 2 of the present invention.

The image decoding apparatus 400 decodes coded image data generated by compression-coding. For example, coded image data is inputted, to the image decoding apparatus 400, on a per block basis as a signal to be decoded. The image decoding apparatus 400 performs variable-length decoding, inverse-quantization, and inverse-transform on the inputted signal to be decoded, to reconstruct image data.

As shown in FIG. 12, the image decoding apparatus 400 includes an entropy decoding unit 410, an inverse-quantization and inverse-transform unit 420, an adder 425, a deblocking filter 430, a memory 440, an intra prediction unit 450, a motion compensation unit 460, and an intra-inter changeover switch 470.

The entropy decoding unit 410 performs variable-length decoding on the input signal (input stream) to reconstruct the quantized coefficients. It should be noted that, here, the input signal (input stream) is the signal to be decoded and is equivalent to per-block data of the coded image data. Furthermore, the entropy decoding unit 410 obtains motion data from the input signal, and outputs the obtained motion data to the motion compensation unit 460.

The inverse-quantization and inverse-transform unit 420 inverse-quantizes the quantized coefficients reconstructed by the entropy decoding unit 410, to reconstruct the transformed coefficients. Then, the inverse-quantization and inverse-transform unit 420 inverse-transforms the reconstructed transformed coefficients to reconstruct the prediction error.

The adder 425 adds up the reconstructed prediction error and the predicted signal to generate a decoded image.

The deblocking filter 430 performs deblocking filtering processing on the generated decoded image. The decoded image on which the deblocking filtering processing has been performed is outputted as a decoded signal.

The memory 440 is a memory for storing a reference image to be used in motion compensation. Specifically, the memory 440 stores a decoded image on which the deblocking filtering processing has been performed.

The intra prediction unit 450 performs intra prediction to generate a predicted signal (intra predicted signal). Specifically, the intra prediction unit 450 generates an intra predicted signal by performing intra prediction with reference to the image around the block (input signal) to be decoded in the decoded image generated by the adder 425.

The motion compensation unit 460 performs motion compensation based on the motion data outputted from the entropy decoding unit 410, to generate a predicted signal (inter predicted signal).

The intra-inter changeover switch 470 selects either the intra predicted signal or the inter predicted signal, and outputs the selected signal as the predicted signal, to the adder 425.

With the above-described configuration, the image decoding apparatus 400 according to Embodiment 2 of the present invention decodes coded image data generated by compression-coding.

It should be noted that, in FIG. 12, the arithmetic decoding unit 300 according to Embodiment 2 of the present invention is included in the entropy decoding unit 410. Specifically, the arithmetic decoding unit 300 performs arithmetic-decoding and multi-value conversion of coded image data on which prediction coding has been performed, as an input stream IS. Furthermore, the signal type information SE is information indicating the position of the quantized coefficient, motion data, the intra prediction direction to be used by the intra prediction unit 450, or the like.

As described above, according to the image decoding apparatus and image decoding method according to Embodiment 2 of the present invention, when context that is associated with the type of the signal to be decoded is hierarchized into a high-order context and a low-order context, the decoding probability information to be used in arithmetic decoding is calculated using high-order probability information corresponding to the high-order context and low-order probability information corresponding to the low-order context. In addition, both the high-order probability information and the low-order probability information are updated based on a binary signal which is the signal generated by performing the arithmetic decoding on the signal to be decoded.

With this, it is possible to correctly decode a signal generated under improved coding efficiency. Specifically, as shown in Embodiment 1, since it is possible to use coding probability information that takes into consideration both overall statistical information according to probability information of the high hierarchical level and detailed probability information according to probability information of the low hierarchical level, coding efficiency can be improved. Specifically, since it is possible to suppress the deterioration of the updating frequency of high-order probability information which is equivalent to a large classification, arithmetic coding adapted to the features of the image data can be performed, and thus coding efficiency can be improved. Furthermore, since low-order probability information which is equivalent to a small classification is used, it is possible to improve the possibility of the prediction of the symbol occurrence probability coming true, and thus coding efficiency can be improved. The image decoding apparatus and the image decoding method according to Embodiment 2 of the present invention can correctly decode a signal generated under improved coding efficiency in the above-described manner.

Embodiment 3

The processing described in the foregoing embodiments can be simply implemented by an independent computer system, by recording, in a recording medium, a program for implementing the configurations for the image coding method and the image decoding method described in the foregoing embodiments. The recording medium may be any recording medium as long as the program can be recorded, such as a magnetic disk, an optical disk, a magnetic optical disk, an IC card, and a semiconductor memory.

In addition, the applications of the image coding method and the image decoding method described in the foregoing embodiments and systems using such methods will be described here.

Figure 13:
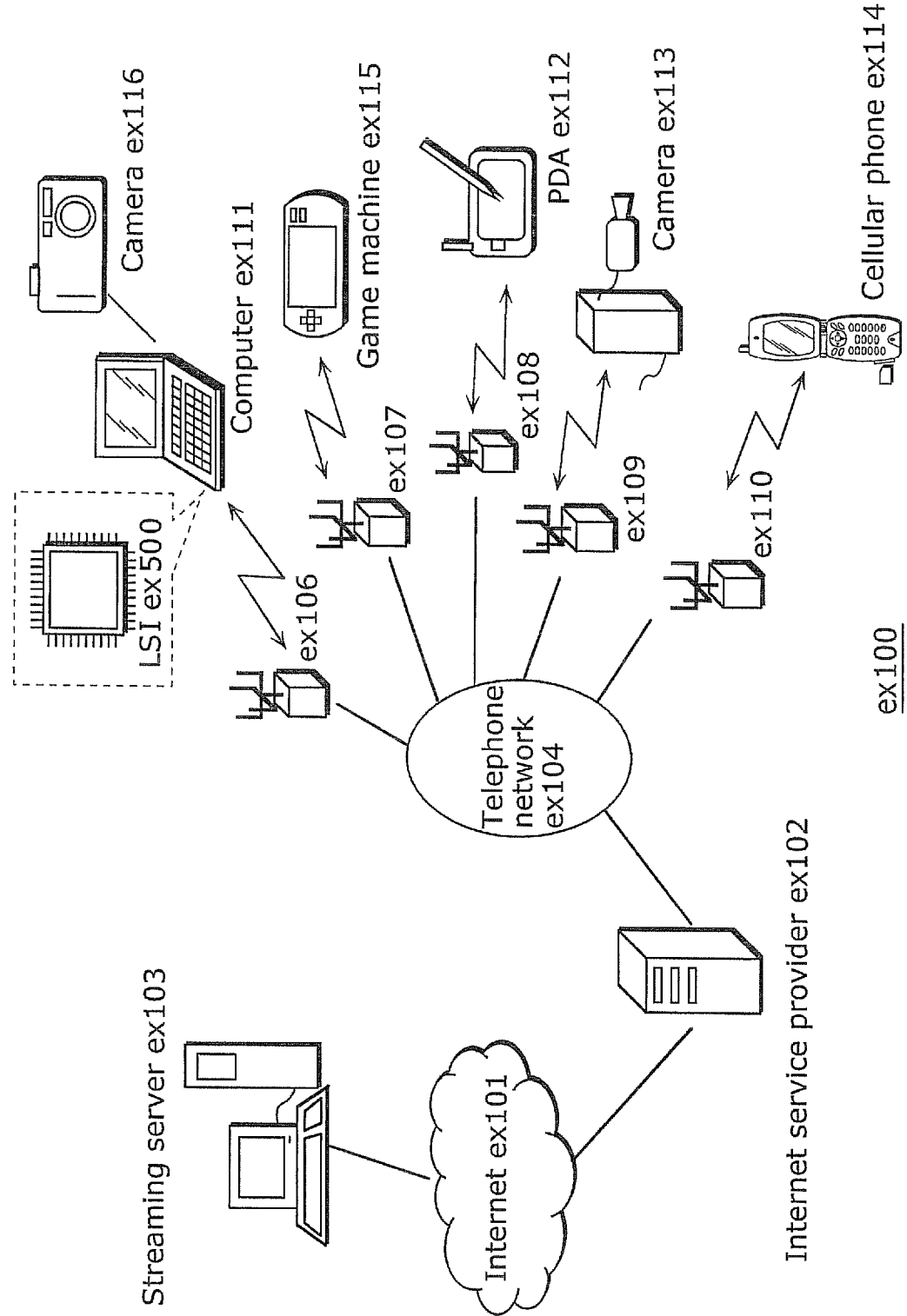
FIG. 13 is a diagram of an overall configuration of a content providing system for implementing content distribution services.

FIG. 13 shows an overall configuration of a content providing system ex100 for implementing content distribution services. The area for which communication services is provided is divided into cells of desired size, and base stations ex106 to ex110 which are fixed wireless stations are placed in each of the cells.

The content providing system ex100 is connected to devices, such as a computer ex111, a personal digital assistant (PDA) ex112, a camera ex113, a cellular phone ex114, and a game machine ex115, via Internet ex101, an Internet service provider ex102, a telephone network ex104, as well as the base stations ex106 to ex110.

However, the configuration of the content providing system ex100 is not limited to the configuration shown in FIG. 13, and a combination in which any of the elements are connected is acceptable. In addition, each of the devices may be directly connected to the telephone network ex104, rather than via the base stations ex106 to ex110 which are the fixed wireless stations. Furthermore, the devices may be interconnected to each other via short distance wireless communication and so on.

The camera ex113, such as a digital video camera, is capable of capturing moving images. A camera ex116, such as a digital video camera, is capable of capturing both still images and moving images. Furthermore, the cellular phone ex114 may be the one that meets any of the standards such as Global System for Mobile Communications (GSM), Code Division Multiple Access (CDMA), Wideband-Code Division Multiple Access (W-CDMA), Long Term Evolution (LTE), and High Speed Packet Access (HSPA). Alternatively, the cellular phone ex114 may be a Personal Handyphone System (PHS) or the like.

In the content providing system ex100, the camera ex113 and others are connected to a streaming server ex103 via the telephone network ex104 and the base station ex109, which enables distribution of a live show and others. For such a distribution, a content (for example, video of a music live show) captured by the user using the camera ex113 is coded as described in the foregoing embodiments, and the coded content is transmitted to the streaming server ex103. On the other hand, the streaming server ex103 carries out stream distribution of the received content data to the clients upon their requests. The clients include the computer ex111, the PDA ex112, the camera ex113, the cellular phone ex114, and the game machine ex115 that are capable of decoding the above-mentioned coded data. Each of the devices that have received the distributed data decodes and reproduces the received coded data.

The captured data may be coded by the camera ex113 or the streaming server ex103 that transmits the data, or the coding processes may be shared between the camera ex113 and the streaming server ex103. Similarly, the distributed data may be decoded by the clients or the streaming server ex103, or the decoding processes may be shared between the clients and the streaming server ex103. Furthermore, the data of the still images and moving images captured by not only the camera ex113 but also the camera ex116 may be transmitted to the streaming server ex103 through the computer ex111. The coding processes in this case may be performed by the camera ex116, the computer ex111, or the streaming server ex103, or shared among them.

Furthermore, the coding and decoding processes may be performed by an LSI ex500 generally included in each of the computer ex111 and the devices. The LSI ex500 may be configured of a single chip or a plurality of chips. Software for coding and decoding pictures may be integrated into some type of a recording medium (such as a CD-ROM, a flexible disk, a hard disk) that is readable by the computer ex111 and others, and the coding and decoding processes may be performed using the software. Furthermore, when the cellular phone ex114 is equipped with a camera, the moving picture data obtained by the camera may be transmitted. The video data is data coded by the LSI ex500 included in the cellular phone ex114.

Furthermore, the streaming server ex103 may be composed of servers and computers, and may decentralize data and process the decentralized data, record, or distribute data.

As described above, the clients can receive and reproduce the coded data in the content providing system ex100. In other words, the clients can receive and decode information transmitted by the user, and reproduce the decoded data in real time in the content providing system ex100, so that the user who does not have any particular right and equipment can implement personal broadcasting.

When each of the devices included in the content providing system performs coding and decoding, the picture coding method and the picture decoding method shown in Embodiment 1 may be used.

The cellular phone ex114 will be described as an example of such a device.

Figure 14:
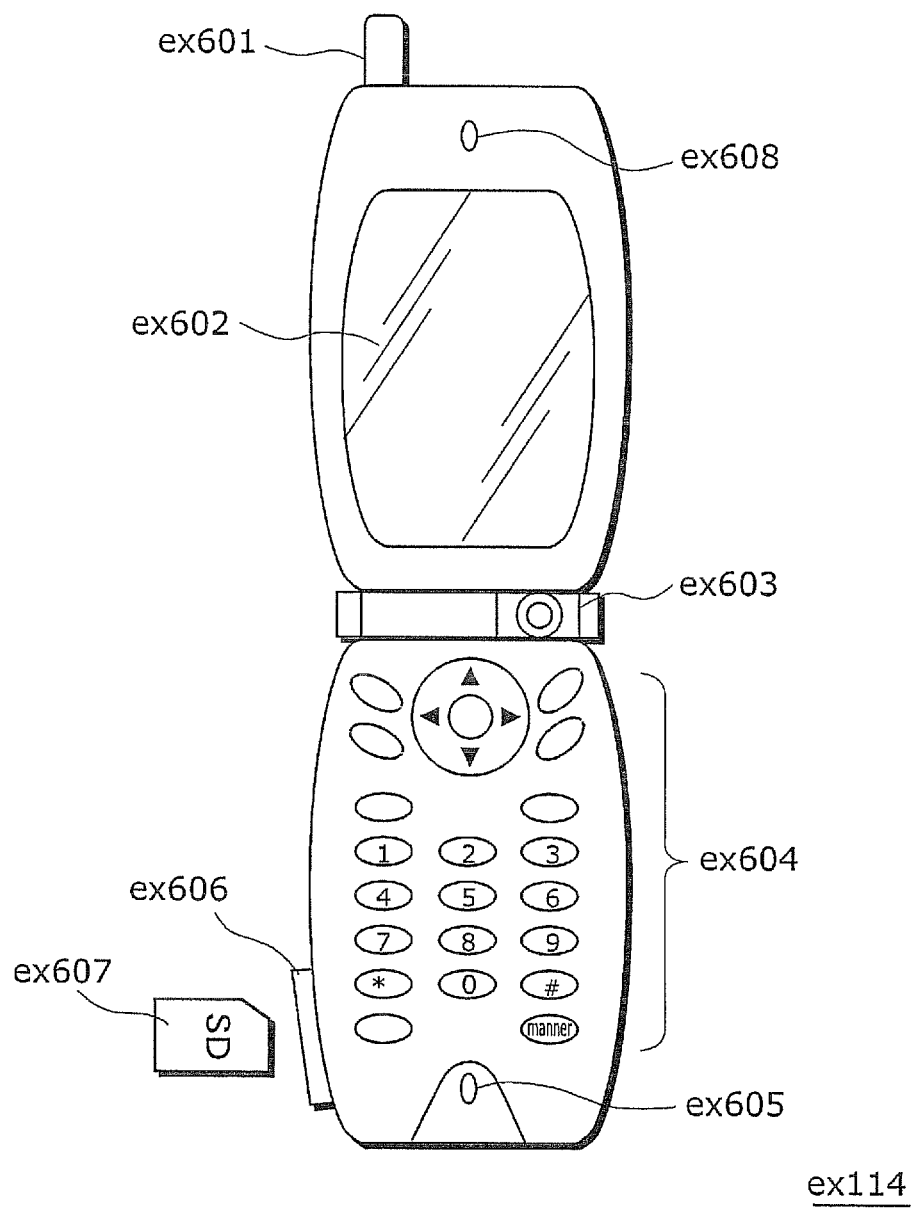
FIG. 14 is a diagram showing an external view of a cellular phone.

FIG. 14 illustrates the cellular phone ex114 that uses the picture coding method and the picture decoding method described in Embodiment 1. The cellular phone ex114 includes: an antenna ex601 for transmitting and receiving radio waves through the base station ex110; a camera unit ex603 such as a CCD camera capable of capturing moving and still pictures; a display unit ex602 such as a liquid crystal display for displaying the data such as decoded video captured by the camera unit ex603 or received by the antenna ex601; a main body unit including a set of operation keys ex604; an audio output unit ex608 such as a speaker for output of audio; an audio input unit ex605 such as a microphone for input of audio; a recording medium ex607 for recording coded or decoded data including data of captured moving or still pictures, data of received e-mails, and data of moving or still pictures; and a slot unit ex606 for enabling the cellular phone ex114 to attach the recording medium ex607. The recording medium ex607 is a medium that stores a flash memory device within a plastic case, for example, an SD Card. The flash memory device is one type of Electrically Erasable and Programmable Read-Only Memory (EEPROM) which is a non-volatile memory that is electrically rewritable and erasable.

Figure 15:
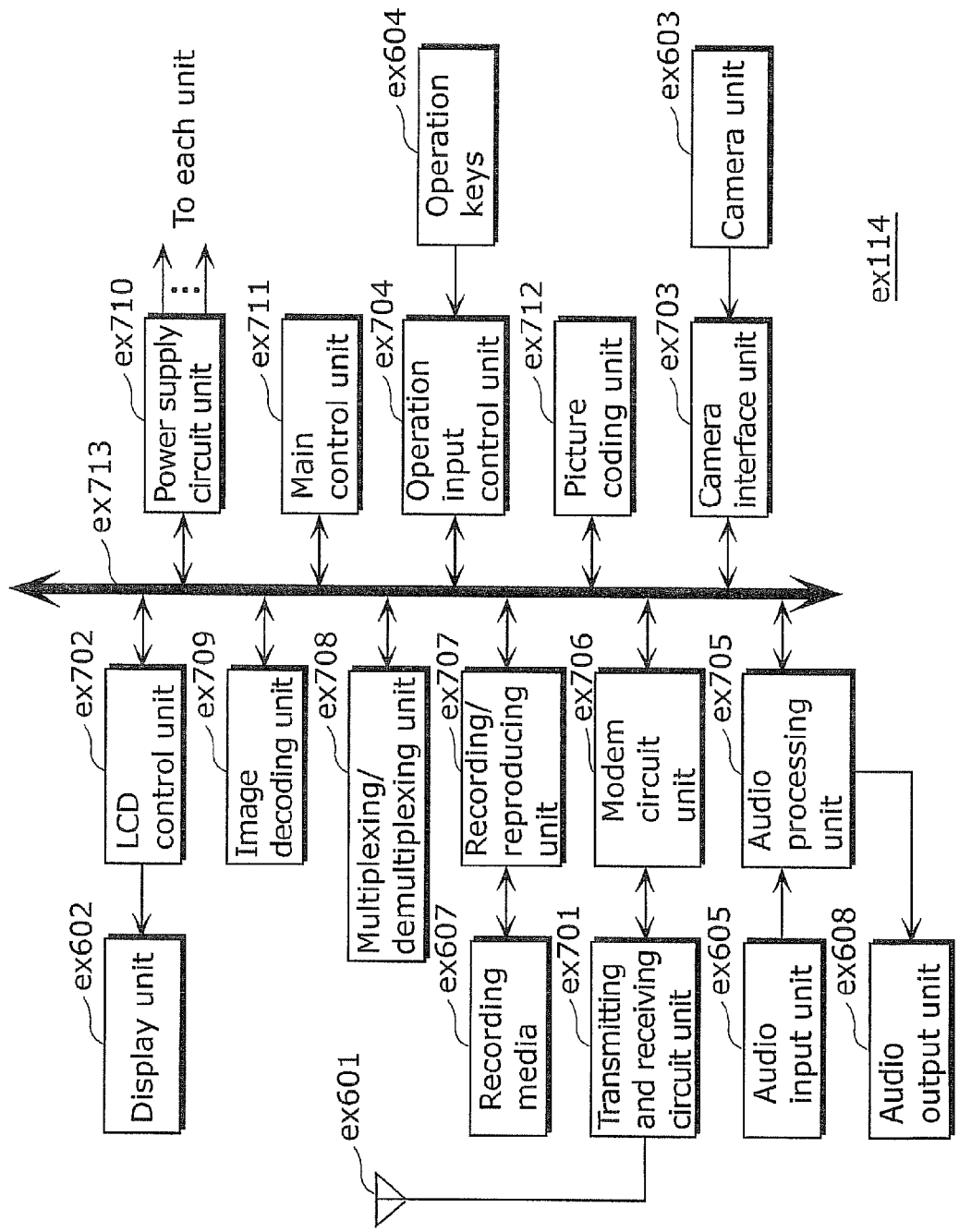
FIG. 15 is a block diagram showing an example of a configuration of a cellular phone.

Next, the cellular phone ex114 will be described with reference to FIG. 15. In the cellular phone ex114, a main control unit ex711 designed to control overall each unit of the main body including the display unit ex602 as well as the operation keys ex604 is connected mutually, via a synchronous bus ex713, to a power supply circuit unit ex710, an operation input control unit ex704, a picture coding unit ex712, a camera interface unit ex703, a liquid crystal display (LCD) control unit ex702, a picture decoding unit ex709, a multiplexing/demultiplexing unit ex708, a recording/reproducing unit ex707, a modem circuit unit ex706, and an audio processing unit ex705.

When a call-end key or a power key is turned ON by a user's operation, the power supply circuit unit ex710 supplies the respective units with power from a battery pack so as to activate the cell phone ex114 that is digital and is equipped with the camera.

In the cellular phone ex114, the audio processing unit ex705 converts the audio signals collected by the audio input unit ex605 in voice conversation mode into digital audio data under the control of the main control unit ex711 including a CPU, ROM, and RAM. Then, the modem circuit unit ex706 performs spread spectrum processing on the digital audio data, and the transmitting and receiving circuit unit ex701 performs digital-to-analog conversion and frequency conversion on the data, so as to transmit the resulting data via the antenna ex601. In addition, in the cellular phone ex114, the transmitting and receiving circuit unit ex701 amplifies the data received by the antenna ex601 in voice conversation mode and performs frequency conversion and the analog-to-digital conversion on the data. Then, the modem circuit unit ex706 performs inverse spread spectrum processing on the data, and the audio processing unit ex705 converts it into analog audio data, so as to output it via the audio output unit ex608.

Furthermore, when an e-mail in data communication mode is transmitted, text data of the e-mail inputted by operating the operation keys ex604 of the main body is sent out to the main control unit ex711 via the operation input control unit ex704. The main control unit ex711 causes the modem circuit unit ex706 to perform spread spectrum processing on the text data, and the transmitting and receiving circuit unit ex701 performs the digital-to-analog conversion and the frequency conversion on the resulting data to transmit the data to the base station ex110 via the antenna ex601.

When picture data is transmitted in data communication mode, the picture data captured by the camera unit ex603 is supplied to the picture coding unit ex712 via the camera interface unit ex703. When the picture data is not transmitted, the picture data captured by the camera unit ex603 can be displayed directly on the display unit ex602 via the camera interface unit ex703 and the LCD control unit ex702.

The picture coding unit ex712 including the picture coding apparatus as described for the present invention compresses and codes the picture data supplied from the camera unit ex603 using the coding method employed by the picture coding apparatus as shown in Embodiment 1 so as to transform the data into coded picture data, and sends the data out to the multiplexing/demultiplexing unit ex708. Furthermore, the cellular phone ex114 simultaneously sends out, as digital audio data, the audio received by the audio input unit ex605 during the capturing with the camera unit ex603 to the multiplexing/demultiplexing unit ex708 via the audio processing unit ex705.

The multiplexing/demultiplexing unit ex708 multiplexes the coded picture data supplied from the picture coding unit ex712 and the audio data supplied from the audio processing unit ex705, using a predetermined method. Then, the modem circuit unit ex706 performs spread spectrum processing on the multiplexed data obtained by the multiplexing/demultiplexing unit ex708. After the digital-to-analog conversion and frequency conversion on the data, the transmitting and receiving circuit unit ex701 transmits the resulting data via the antenna ex601.

When receiving data of a video file which is linked to a Web page and others in data communication mode, the modem circuit unit ex706 performs inverse spread spectrum processing on the data received from the base station ex110 via the antenna ex601, and sends out the multiplexed data obtained as a result of the inverse spread spectrum processing to the multiplexing/demultiplexing unit ex708.

In order to decode the multiplexed data received via the antenna ex601, the multiplexing/demultiplexing unit ex708 demultiplexes the multiplexed data into a bit stream of picture data and that of audio data, and supplies the coded picture data to the picture decoding unit ex709 and the audio data to the audio processing unit ex705, respectively via the synchronous bus ex713.

Next, the picture decoding unit ex709 including the picture decoding apparatus as described for the present invention decodes the bit stream of the picture data using the decoding method corresponding to the coding method as shown in Embodiment 1 so as to generate reproduced video data, and supplies this data to the display unit ex602 via the LCD control unit ex702. Thus, the video data included in the video file linked to the Web page, for instance, is displayed. Simultaneously, the audio processing unit ex705 converts the audio data into analog audio data, and supplies the data to the audio output unit ex608. Thus, the audio data included in the video file linked to the Web page, for instance, is reproduced.

Figure 16:
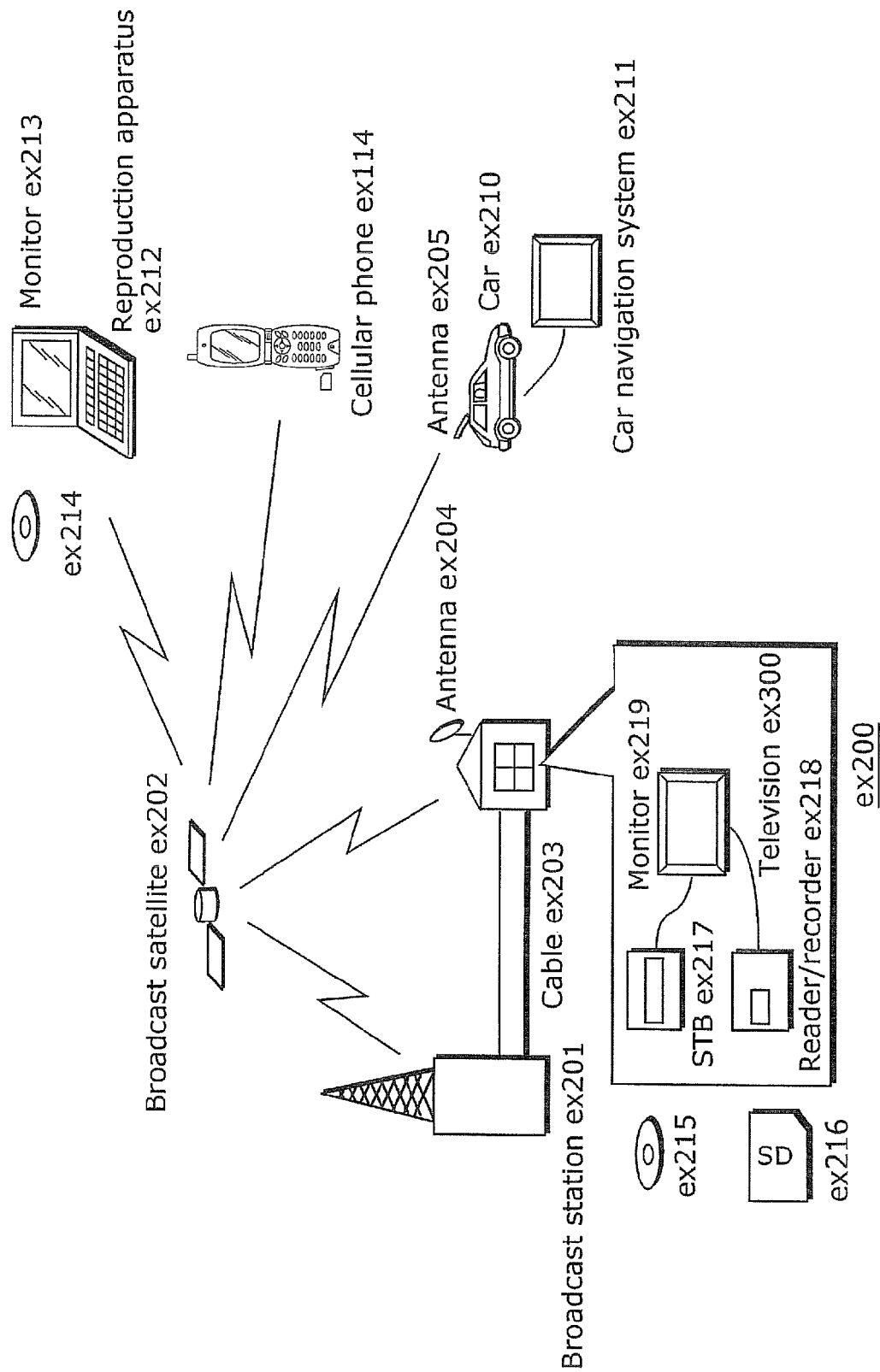
FIG. 16 is a schematic diagram showing an example of an overall configuration of a digital broadcasting system.

The present invention is not limited to the above-mentioned system because terrestrial or satellite digital broadcasting has been in the news lately, and at least either the picture coding apparatus or the picture decoding apparatus described in Embodiment 1 can be incorporated into a digital broadcasting system as shown in FIG. 16. More specifically, a broadcast station ex201 communicates or transmits, via radio waves to a broadcast satellite ex202, audio data, video data, or a bit stream obtained by multiplexing the audio data and the video data. Upon receipt of the bit stream, the broadcast satellite ex202 transmits radio waves for broadcasting. Then, a home-use antenna ex204 with a satellite broadcast reception function receives the radio waves, and a device, such as a television (receiver) ex300 and a set top box (STB) ex217 decodes a coded bit stream and reproduces the decoded bit stream. Furthermore, a reader/recorder ex218 that reads and decodes such a bit stream obtained by multiplexing picture data and audio data that are recorded on recording media ex215 and 216, such as a CD and a DVD may include the picture decoding apparatus as shown in Embodiment 1. In this case, the reproduced video signals are displayed on a monitor ex219. It is also possible to implement the picture decoding apparatus in the set top box ex217 connected to a cable ex203 for a cable television or an antenna ex204 for satellite and/or terrestrial broadcasting, so as to reproduce the video signals on the monitor ex219 of the television ex300. The picture decoding apparatus may be included not in the set top box but in the television ex300. Also, a car ex210 having an antenna ex205 can receive signals from the satellite ex202 or the base station ex201 for reproducing video on a display device such as a car navigation system ex211 set in the car ex210.

Furthermore, the picture decoding apparatus or the picture coding apparatus as shown in Embodiment 1 can be implemented in the reader/recorder ex218 (i) for reading and decoding the video data, the audio data, or the coded bit stream obtained by multiplexing the video data and the audio data, or (ii) for coding the video data, the audio data, or the coded bit stream obtained by multiplexing the video data and the audio data and recording the resulting data as the multiplexed data on the recording medium ex215. Here, the video data and the audio data are recorded on the recording medium ex215, such as a BD and a DVD. In this case, the reproduced video signals are displayed on the monitor ex219. Furthermore, the reproduced video signals can be reproduced by another device or system, using the recording medium ex215 on which the coded bit stream is recorded. For example, another reproduction apparatus ex212 can reproduce the video signals on a monitor ex213, using a recording medium ex214 on which the coded bit stream is copied.

Furthermore, it is also possible to implement the picture decoding apparatus in the set top box ex217 connected to the cable ex203 for a cable television or the antenna ex204 for satellite and/or terrestrial broadcasting, so as to reproduce the video signals on the monitor ex219 of the television ex300. The picture decoding apparatus may be included not in the set top box but in the television ex300.

Figure 17:
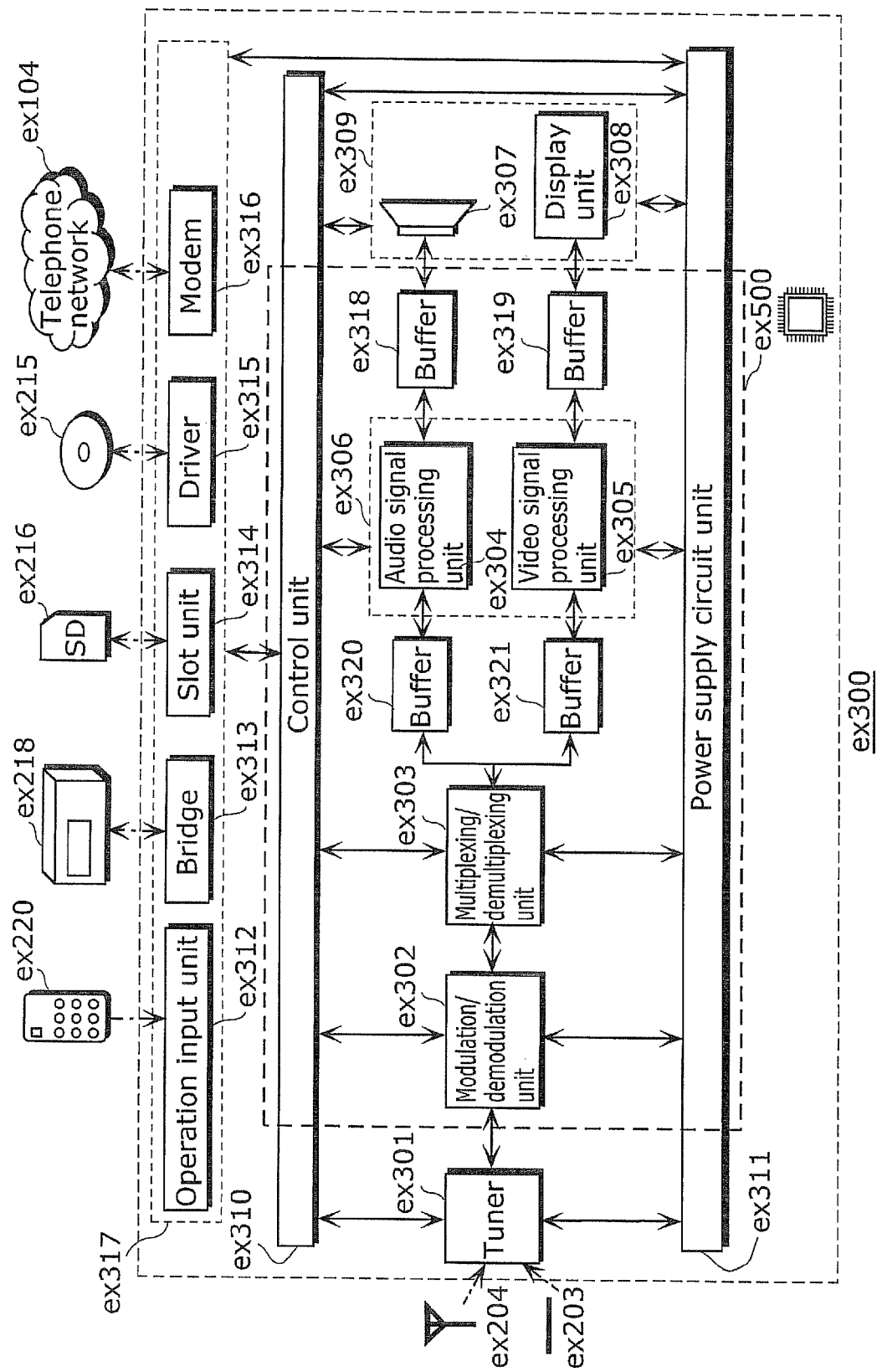
FIG. 17 is a block diagram showing an example of a configuration of a television.

FIG. 17 illustrates the television (receiver) ex300 that uses the picture coding method and the picture decoding method described in Embodiment 1. The television ex300 includes: a tuner ex301 that obtains or provides a bit stream of video information from and through the antenna ex204 or the cable ex203, etc. that receives a broadcast; a modulation/demodulation unit ex302 that demodulates the received coded data or modulates data into coded data to be supplied outside; and a multiplexing/demultiplexing unit ex303 that demultiplexes the modulated data into video data and audio data, or multiplexes the coded video data and audio data into data. The television ex300 further includes: a signal processing unit ex306 including an audio signal processing unit ex304 and a video signal processing unit ex305 that decode audio data and video data and code audio data and video data, respectively; a speaker ex307 that provides the decoded audio signal; and an output unit ex309 including a display unit ex308 that displays the decoded video signal, such as a display. Furthermore, the television ex300 includes an interface unit ex317 including an operation input unit ex312 that receives an input of a user operation. Furthermore, the television ex300 includes a control unit ex310 that controls overall each constituent element of the television ex300, and a power supply circuit unit ex311 that supplies power to each of the elements. Other than the operation input unit ex312, the interface unit ex317 may include: a bridge ex313 that is connected to an external device, such as the reader/recorder ex218; a slot unit ex314 for enabling attachment of the recording medium ex216, such as an SD card; a driver ex315 to be connected to an external recording medium, such as a hard disk; and a modem ex316 to be connected to a telephone network. Here, the recording medium ex216 can electrically record information using a non-volatile/volatile semiconductor memory element for storage. The constituent elements of the television ex300 are connected to each other through a synchronous bus.

First, a configuration in which the television ex300 decodes data obtained from outside through the antenna ex204 and others and reproduces the decoded data will be described. In the television ex300, upon receipt of a user operation from a remote controller ex220 and others, the multiplexing/demultiplexing unit ex303 demultiplexes the video data and audio data demodulated by the modulation/demodulation unit ex302, under control of the control unit ex310 including a CPU. Furthermore, the audio signal processing unit ex304 decodes the demultiplexed audio data, and the video signal processing unit ex305 decodes the demultiplexed video data, using the decoding method described in Embodiment 1, in the television ex300. The output unit ex309 provides the decoded video signal and audio signal outside, respectively. When the output unit ex309 provides the video signal and the audio signal, the signals may be temporarily stored in buffers ex318 and ex319, and others so that the signals are reproduced in synchronization with each other. Furthermore, the television ex300 may read a coded bit stream not through a broadcast and others but from the recording media ex215 and ex216, such as a magnetic disk, an optical disk, and a SD card. Next, a configuration in which the television ex300 codes an audio signal and a video signal, and transmits the data outside or writes the data on a recording medium will be described. In the television ex300, upon receipt of a user operation from the remote controller ex220 and others, the audio signal processing unit ex304 codes an audio signal, and the video signal processing unit ex305 codes a video signal, under control of the control unit ex310 using the coding method as described in Embodiment 1. The multiplexing/demultiplexing unit ex303 multiplexes the coded video signal and audio signal, and provides the resulting signal outside. When the multiplexing/demultiplexing unit ex303 multiplexes the video signal and the audio signal, the signals may be temporarily stored in buffers ex320 and ex321, and others so that the signals are reproduced in synchronization with each other. Here, the buffers ex318 to ex321 may be plural as illustrated, or at least one buffer may be shared in the television ex300. Furthermore, data may be stored in a buffer other than the buffers ex318 to ex321 so that the system overflow and underflow may be avoided between the modulation/demodulation unit ex302 and the multiplexing/demultiplexing unit ex303, for example.

Furthermore, the television ex300 may include a configuration for receiving an AV input from a microphone or a camera other than the configuration for obtaining audio and video data from a broadcast or a recording medium, and may code the obtained data. Although the television ex300 can code, multiplex, and provide outside data in the description, it may be not capable of coding, multiplexing, and providing outside data but capable of only one of receiving, decoding, and providing outside data.

Furthermore, when the reader/recorder ex218 reads or writes a coded bit stream from or in a recording medium, one of the television ex300 and the reader/recorder ex218 may decode or code the coded bit stream, and the television ex300 and the reader/recorder ex218 may share the decoding or coding.

Figure 18:
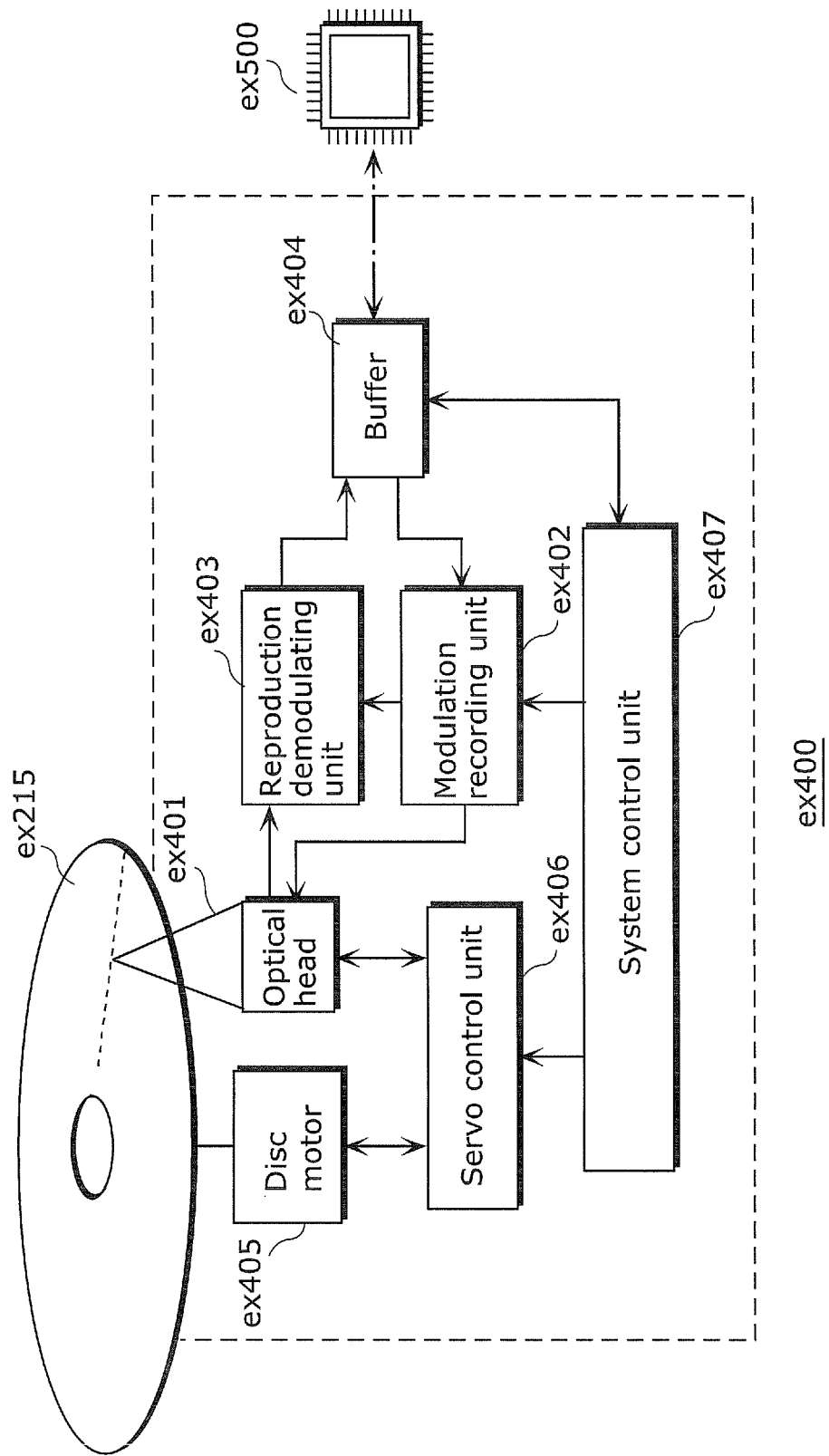
FIG. 18 is a block diagram showing an example of a configuration of an information reproducing/recording unit that reads and writes information from or on a recording medium that is an optical disk.

As an example, FIG. 18 illustrates a configuration of an information reproducing/recording unit ex400 when data is read or written from or in an optical disk. The information reproducing/recording unit ex400 includes constituent elements ex401 to ex407 to be described hereinafter. The optical head ex401 irradiates a laser spot on a recording surface of the recording medium ex215 that is an optical disk to write information, and detects reflected light from the recording surface of the recording medium ex215 to read the information. The modulation recording unit ex402 electrically drives a semiconductor laser included in the optical head ex401, and modulates the laser light according to recorded data. The reproduction demodulating unit ex403 amplifies a reproduction signal obtained by electrically detecting the reflected light from the recording surface using a photo detector included in the optical head ex401, and demodulates the reproduction signal by separating a signal component recorded on the recording medium ex215 to reproduce the necessary information. The buffer ex404 temporarily holds the information to be recorded on the recording medium ex215 and the information reproduced from the recording medium ex215. A disk motor ex405 rotates the recording medium ex215. A servo control unit ex406 moves the optical head ex401 to a predetermined information track while controlling the rotation drive of the disk motor ex405 so as to follow the laser spot. The system control unit ex407 controls overall the information reproducing/recording unit ex400. The reading and writing processes can be implemented by the system control unit ex407 using various information stored in the buffer ex404 and generating and adding new information as necessary, and by the modulation recording unit ex402, the reproduction demodulating unit ex403, and the servo control unit ex406 that record and reproduce information through the optical head ex401 while being operated in a coordinated manner. The system control unit ex407 includes, for example, a microprocessor, and executes processing by causing a computer to execute a program for read and write.

Although the optical head ex401 irradiates a laser spot in the description, it may perform high-density recording using near field light.

Figure 19:
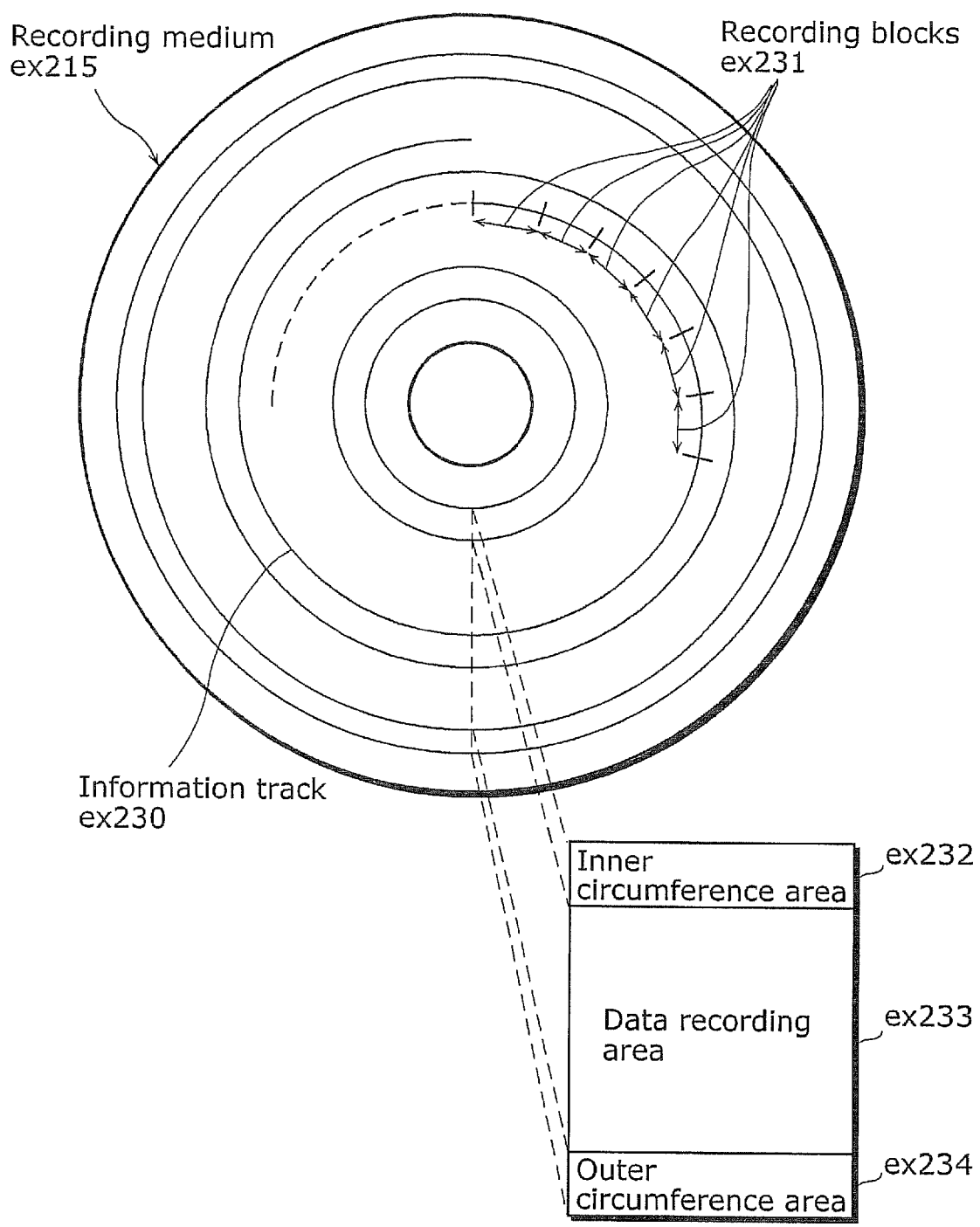
FIG. 19 is a diagram showing an example of a configuration of a recording medium that is an optical disk.

FIG. 19 schematically illustrates the recording medium ex215 that is the optical disk. On the recording surface of the recording medium ex215, guide grooves are spirally formed, and an information track ex230 records, in advance, address information indicating an absolute position on the disk according to change in a shape of the guide grooves. The address information includes information for determining positions of recording blocks ex231 that are a unit for recording data. An apparatus that records and reproduces data reproduces the information track ex230 and reads the address information so as to determine the positions of the recording blocks. Furthermore, the recording medium ex215 includes a data recording area ex233, an inner circumference area ex232, and an outer circumference area ex234. The data recording area ex233 is an area for use in recording the user data. The inner circumference area ex232 and the outer circumference area ex234 that are inside and outside of the data recording area ex233, respectively are for specific use except for recording the user data. The information reproducing/recording unit 400 reads and writes coded audio data, coded video data, or coded data obtained by multiplexing the coded audio data and the coded video data, from and on the data recording area ex233 of the recording medium ex215.

Although an optical disk having a layer, such as a DVD and a BD is described as an example in the description, the optical disk is not limited to such, and may be an optical disk having a multilayer structure and capable of being recorded on a part other than the surface. Furthermore, the optical disk may have a structure for multidimensional recording/reproduction, such as recording of information using light of colors with different wavelengths in the same portion of the optical disk and recording information having different layers from various angles.

Furthermore, the car ex210 having the antenna ex205 can receive data from the satellite ex202 and others, and reproduce video on the display device such as the car navigation system ex211 set in the car ex210, in a digital broadcasting system ex200. Here, a configuration of the car navigation system ex211 will be a configuration, for example, including a GPS receiving unit from the configuration illustrated in FIG. 17. The same will be true for the configuration of the computer ex111, the cellular phone ex114, and others. Furthermore, similarly to the television ex300, a terminal such as the cellular phone ex114 may have 3 types of implementation configurations including not only (i) a transmitting and receiving terminal including both a coding apparatus and a decoding apparatus, but also (ii) a transmitting terminal including only a coding apparatus and (iii) a receiving terminal including only a decoding apparatus.

As such, the picture coding method and the picture decoding method in Embodiment 1 can be used in any of the devices and systems described. Thus, the advantages described in Embodiment 1 can be obtained.

Furthermore, the present invention is not limited to Embodiments, and various modifications and revisions are possible without departing from the scope of the present invention.

Embodiment 4

Figure 20:
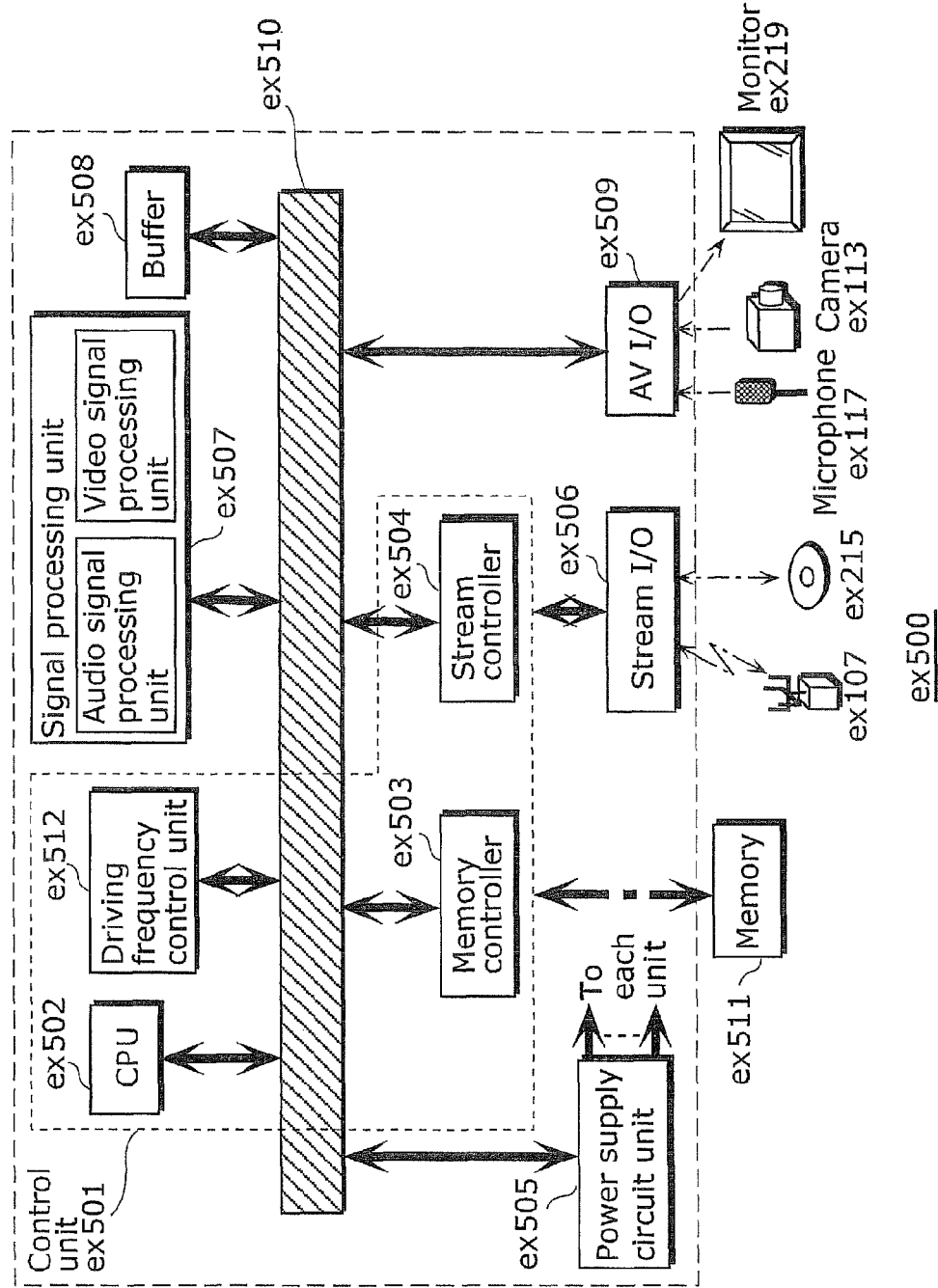
FIG. 20 is a block diagram showing an example of a configuration of an integrated circuit for implementing the picture coding method and the picture decoding method according to each of Embodiments.
Figure 21:
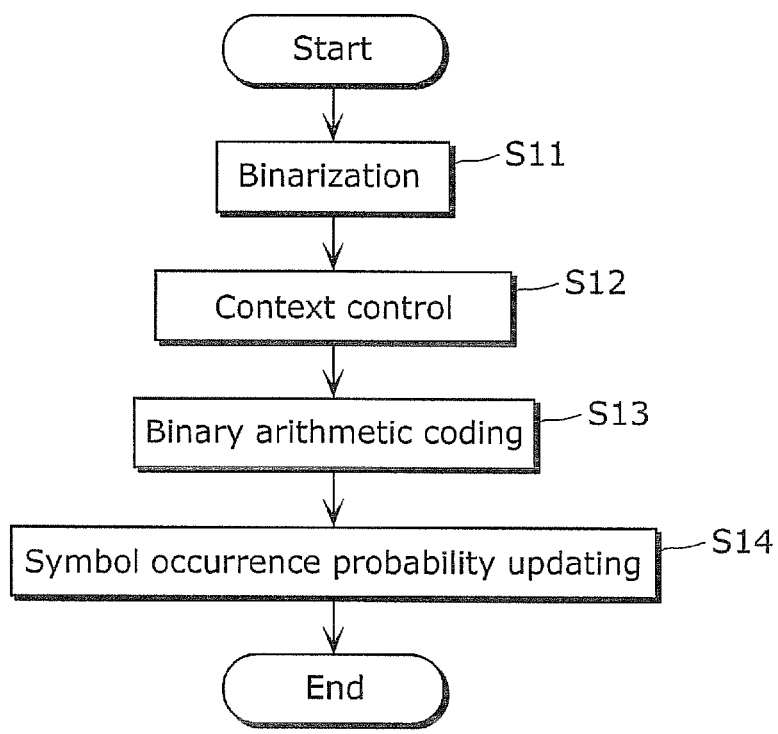
FIG. 21 is a flowchart showing a conventional arithmetic coding method.
Figure 22:
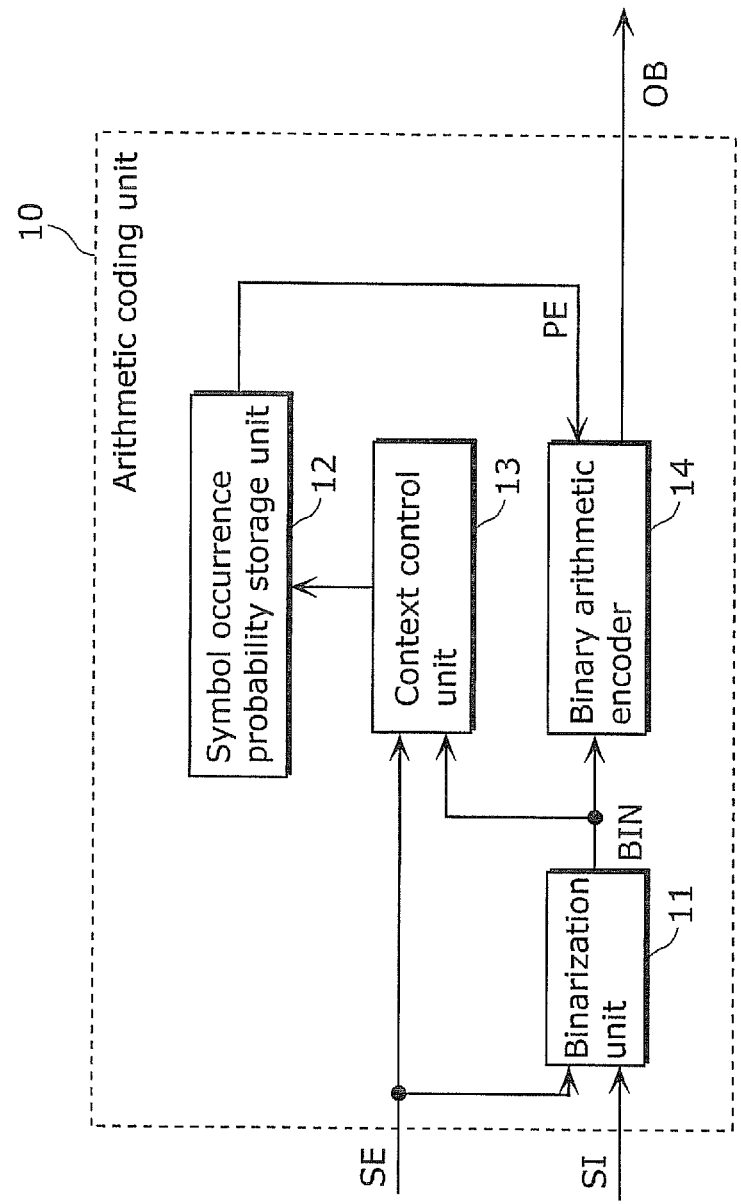
FIG. 22 is a block diagram showing a configuration of a conventional arithmetic coding apparatus.

Each of the picture coding method, the picture coding apparatus, the picture decoding method, and the picture decoding apparatus in each of Embodiments is typically achieved in the form of an integrated circuit or a Large Scale Integrated (LSI) circuit. As an example of the LSI, FIG. 20 illustrates a configuration of the LSI ex500 that is made into one chip. The LSI ex500 includes elements ex501 to ex509 to be described below, and the elements are connected to each other through a bus ex510. The power supply circuit unit ex505 is activated by supplying each of the elements with power when power is on.

For example, when coding is performed, the LSI ex500 receives an AV signal from a microphone ex117, a camera ex113, and others through an AV IO ex509 under control of a control unit ex501 including a CPU ex502, a memory controller ex503, and a stream controller ex504. The received AV signal is temporarily stored in a memory ex511 outside the LSI ex500, such as an SDRAM. Under control of the control unit ex501, the stored data is subdivided into data portions according to the processing amount and speed as necessary. Then, the data portions are transmitted to a signal processing unit ex507. The signal processing unit ex507 codes an audio signal and/or a video signal. Here, the coding of the video signal is the coding described in Embodiments. Furthermore, the signal processing unit ex507 sometimes multiplexes the coded audio data and the coded video data, and a stream I/O ex506 provides the multiplexed data outside. The provided bit stream is transmitted to a base station ex107, or written on the recording medium ex215. When data sets are multiplexed, the data sets should be temporarily stored in the buffer ex508 so that the data sets are synchronized with each other.

For example, when coded data is decoded, the LSI ex500 temporarily stores, in the memory ex511, the coded data obtained from the base station ex107 through the stream I/O ex506 or read from the recording medium ex215 under control of the control unit ex501. Under control of the control unit ex501, the stored data is subdivided into data portions according to the processing amount and speed as necessary. Then, the data portions are transmitted to the signal processing unit ex507. The signal processing unit ex507 decodes audio data and/or video data. Here, the decoding of the video signal is the decoding described in Embodiments. Furthermore, a decoded audio signal and a decoded video signal may be temporarily stored in the buffer ex508 and others so that the signals can be reproduced in synchronization with each other. Each of the output units, such as the cellular phone ex114, the game machine ex115, and the television ex300 provides the decoded output signal through, for example, the memory 511 as necessary.

Although the memory ex511 is an element outside the LSI ex500 in the description, it may be included in the LSI ex500. The buffer ex508 is not limited to one buffer, but may be composed of buffers. Furthermore, the LSI ex500 may be made into one chip or a plurality of chips.

The name used here is LSI, but it may also be called IC, system LSI, super LSI, or ultra LSI depending on the degree of integration.

Moreover, ways to achieve integration are not limited to the LSI, and a special circuit or a general purpose processor and so forth can also achieve the integration. Field Programmable Gate Array (FPGA) that can be programmed after manufacturing LSI or a reconfigurable processor that allows re-configuration of the connection or configuration of an LSI can be used for the same purpose.

In the future, with advancement in semiconductor technology, a brand-new technology may replace LSI. The functional blocks can be integrated using such a technology. The possibility is that the present invention is applied to biotechnology.

Although the image coding method, the image decoding method, the image coding apparatus, and the image decoding apparatus in the present invention are described based on Embodiments, the present invention is not limited to such Embodiments. Various modifications to the present embodiments and forms configured by combining constituent elements in different embodiments that can be conceived by those skilled in the art without departing from the teachings of the present invention are included in the scope of the present invention.

INDUSTRIAL APPLICABILITY

The image coding method and the image decoding method according to the present invention can be used in various applications, and can be used in high-resolution information display devices and image-capturing devices such as televisions, digital video recorders, car navigation systems, cellular phones, digital cameras, digital video cameras, and so on.

REFERENCE SIGNS LIST 10, 100 Arithmetic coding unit
11, 101 Binarization unit
12 Symbol occurrence probability storage unit
13 Context control unit
14, 105 Binary arithmetic encoder
102 Symbol occurrence probability hierarchy storage unit
103 Hierarchical-context control unit
104 Symbol occurrence probability calculation unit
200 Image coding apparatus
205 Subtractor
210 Transform and quantization unit
220 Entropy coding unit
230, 420 Inverse-quantization and inverse-transform unit
235, 425 Adder
240, 430 Deblocking filter
250, 440 Memory
260, 450 Intra prediction unit
270 Motion detection unit
280, 460 Motion compensation unit
290, 470 Intra-inter changeover switch
300 Arithmetic decoding unit
301 Binary arithmetic decoder
302 Symbol occurrence probability hierarchy storage unit
303 Hierarchical-context control unit
304 Symbol occurrence probability calculation unit
305 Multi-value conversion unit
400 Image decoding apparatus
410 Entropy decoding unit
ex100 Content providing system
ex101 Internet
ex102 Internet service provider
ex103 Streaming server
ex104 Telephone network
ex106, ex107, ex108, ex109, ex110 Base station
ex111 Computer
ex112 PDA
ex113, ex116 Camera
ex114 Cellular phone equipped with camera (cellular phone)
ex115 Game machine
ex117 Microphone
ex200 Digital broadcasting system
ex201 Broadcast station
ex202 Broadcast satellite (satellite)
ex203 Cable
ex204, ex205, ex601 Antenna ex210 Car
ex211 Car navigation system
ex212 Reproduction apparatus
ex213, ex219 Monitor
ex214, ex215, ex216, ex607 Recording medium
ex217 Set top box (STB)
ex218 Reader/recorder
ex220 Remote controller
ex230 Information track
ex231 Recording blocks
ex232 Inner circumference area
ex233 Data recording area
ex234 Outer circumference area
ex300 Television
ex301 Tuner
ex302 Modulation/demodulation unit
ex303 Multiplexing/demultiplexing unit
ex304 Audio signal processing unit
ex305 Video signal processing unit
ex306, ex507 Signal processing unit
ex307 Speaker
ex308, ex602 Display unit
ex309 Output unit
ex310, ex501 Control unit
ex311, ex505, ex710 Power supply circuit unit
ex312 Operation input unit
ex313 Bridge
ex314, ex606 Slot unit
ex315 Driver
ex316 Modem
ex317 Interface unit
ex318, ex319, ex320, ex321, ex404, ex508 Buffer
ex400 Information reproducing/recording unit
ex401 Optical head
ex402 Modulation recording unit
ex403 Reproduction demodulating unit
ex405 Disk motor
ex406 Servo control unit
ex407 System control unit
ex500 LSI
ex502 CPU
ex503 Memory controller
ex504 Stream controller
ex506 Stream I/O
ex509 AV IO
ex510 Bus
ex603 Camera unit
ex604 Operation keys
ex605 Audio input unit
ex608 Audio output unit
ex701 Transmitting and receiving circuit unit
ex702 LCD control unit
ex703 Camera interface unit (camera I/F unit)
ex704 Operation input control unit
ex705 Audio processing unit
ex706 Modem circuit unit
ex707 Recording/reproducing unit
ex708 Multiplexing/demultiplexing unit
ex709 Picture decoding unit
ex711 Main control unit
ex712 Picture coding unit
ex713 Synchronous bus

The invention claimed is:

1. An image decoding method for decoding coded image data, said image decoding method comprising:
    determining (i) a low-order context which is a context associated with a type of a single quantization coefficient to be decoded of the coded image data and (ii) a high-order context that is common to the low-order context and a context associated with another type;
    calculating decoding probability information to be used in arithmetic decoding of the single quantization coefficient to be decoded, using (i) high-order probability information corresponding to the determined high-order context and (ii) low-order probability information corresponding to the determined low-order context;
    performing the arithmetic decoding on each binary symbol of the single quantization coefficient to be decoded, using (i) the high-order probability information corresponding to the determined high-order context and (ii) the low-order probability information corresponding to the determined low-order context, to generate a binary signal;
    performing multi-value conversion of the binary signal to reconstruct image data; and
    updating the high-order probability information and the low-order probability information based on the binary symbol.

2. The image decoding method according to claim 1, further comprising obtaining type information indicating the type of the single quantization coefficient to be decoded,
    wherein in said determining, the high-order probability information and the low-order probability information are determined by referring, based on the type information, to a table in which the following are associated with one another: a plurality of types; a high-order context common to the types; and low-order contexts each associated with a corresponding one of the types.

3. The image decoding method according to claim 1, wherein in said calculating, the decoding probability information is calculated by weighted-summation of the high-order probability information and the low-order probability information.

4. The image decoding method according to claim 1, further comprising obtaining a control signal to be used in the calculation of the decoding probability information,
    wherein in said calculating, the decoding probability information is calculated using the high-order probability information, the low-order probability information, and the control signal.

5. The image decoding method according to claim 4, further comprising decoding the control signal.

6. The image decoding method according to claim 1, wherein each of the high-order probability information and the low-order probability information is an index indicating a value of a symbol occurrence probability.

7. The image decoding method according to claim 1, wherein each of the high-order probability information and the low-order probability information is a value of a symbol occurrence probability.

8. An image decoding apparatus that decodes coded image data, said image decoding apparatus comprising:
    a context control unit configured to determine (i) a low-order context which is a context associated with a type of a single quantization coefficient to be decoded of the coded image data and (ii) a high-order context that is common to the low-order context and a context associated with another type;
    a probability information calculation unit configured to calculate decoding probability information to be used in arithmetic decoding of the single quantization coefficient to be decoded, using (i) high-order probability information corresponding to the determined high-order context and (ii) low-order probability information corresponding to the determined low-order context;

an arithmetic decoding unit configured to perform the arithmetic decoding on each binary symbol of the single quantization coefficient to be decoded, using (i) the high-order probability information corresponding to the determined high-order context and (ii) the low-order probability information corresponding to the determined low-order context, to generate a binary signal; and a multi-value conversion unit configured to perform multi-value conversion of the binary signal to reconstruct image data, wherein said context control unit is further configured to update the high-order probability information and the low-order probability information based on the binary symbol.

9. The image decoding apparatus according to claim 8, wherein said image decoding apparatus is configured as an integrated circuit.

10. A non-transitory computer-readable recording medium on which a program is stored, the program causing a computer to execute the image decoding method according to claim 1.

* * * * *